United States Patent
Ko et al.

(10) Patent No.: US 7,311,857 B2
(45) Date of Patent: Dec. 25, 2007

(54) ETCHING COMPOSITION, METHOD OF PREPARING THE SAME, METHOD OF ETCHING AN OXIDE FILM, AND METHOD OF MANUFACTURING A SEMICONDUCTOR DEVICE

(75) Inventors: Yong-Kyun Ko, Gyeonggi-do (KR); Sang-Mun Chon, Gyeonggi-do (KR); In-Hoi Doh, Gyeonggi-do (KR); Pil-Kwon Jun, Gyeonggi-do (KR); Sang-Mi Lee, Gyeonggi-do (KR); Kwang-shin Lim, Gyeonggi-do (KR); Myoung-Ok Han, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 127 days.

(21) Appl. No.: 10/962,508

(22) Filed: Oct. 13, 2004

(65) Prior Publication Data

US 2005/0081883 A1    Apr. 21, 2005

(30) Foreign Application Priority Data

Oct. 17, 2003  (KR) ............... 10-2003-0072692
Jan. 5, 2004   (KR) ............... 10-2004-0000235

(51) Int. Cl.
    *C09K 13/04*      (2006.01)
(52) U.S. Cl. ............. 252/79.2; 252/79.1; 252/79.3; 252/79.4
(58) Field of Classification Search .......... 252/79.1, 252/79.2, 79.3, 79.4
    See application file for complete search history.

(56) References Cited

U.S. PATENT DOCUMENTS

| | | | | |
|---|---|---|---|---|
| 3,931,030 A | * | 1/1976 | Ohno | 252/79.4 |
| 5,755,989 A | * | 5/1998 | Ishii et al. | 252/79.4 |
| 6,303,506 B1 | * | 10/2001 | Nojo et al. | 438/692 |
| 6,447,563 B1 | * | 9/2002 | Mahulikar | 51/309 |
| 6,506,314 B1 | * | 1/2003 | Whitney et al. | 216/100 |
| 6,799,883 B1 | * | 10/2004 | Urquhart et al. | 366/152.4 |
| 2004/0198057 A1 | * | 10/2004 | Huang et al. | 438/694 |
| 2004/0203217 A1 | * | 10/2004 | Lai et al. | 438/435 |

FOREIGN PATENT DOCUMENTS

DE    0690772 B1 * 11/1993
EP    0 278 628 B1   7/1991

(Continued)

OTHER PUBLICATIONS

Rompp Lexikon Chemi, 10th Edition, G. Thieme Verlag Stuttgart/New York 1998, pp. 3505-3506 and 4155.

*Primary Examiner*—Nadine G. Norton
*Assistant Examiner*—Mahmoud Dahimene
(74) *Attorney, Agent, or Firm*—Volentine & Whitt, PLLC

(57) ABSTRACT

An exemplary etching composition includes about 0.1 to 8% by weight of hydrogen fluoride, about 10 to 25% by weight of ammonium fluoride, about 0.0001 to 3% by weight of a non-ionic polymer surfactant, and water. Using the composition in a wet etching process, an oxide layer may be selectively removed while a pattern or storage electrode including polysilicon may be effectively passivated. The oxide layer may be removed with a high etching selectivity, while at the same time minimizing damage to the polysilicon layer.

3 Claims, 21 Drawing Sheets

FOREIGN PATENT DOCUMENTS

| | | |
|---|---|---|
| EP | 0 690 772 B1 | 5/1998 |
| JP | 1999-0082131 | 11/1999 |
| KR | 1997-8397 | 2/1997 |
| KR | 00223768 | 7/1999 |
| KR | 00262528 | 5/2000 |
| KR | 1020030050026 A | 6/2003 |

* cited by examiner

FIG. 4A
(PRIOR ART)

|     |     |     | 410 | 416 | 413 |     |     |
|-----|-----|-----|-----|-----|-----|-----|-----|
|     |     | 413 | 426 | 426 | 426 | 419 |     |
|     | 403 | 425 | 432 | 431 | 434 | 430 | 432 |
| 380 | 417 | 433 | 435 | 436 | 438 | 435 | 427 | 403 |
| 387 | 424 | 437 | 441 | 439 | 442 | 438 | 429 | 410 |
| 375 | 423 | 434 | 440 | 442 | 442 | 438 | 431 | 404 |
| 374 | 412 | 428 | 435 | 436 | 436 | 432 | 420 | 390 |
|     | 386 | 414 | 430 | 429 | 430 | 426 | 402 |
|     | 385 | 415 | 415 | 414 | 407 | 373 |
|     |     |     | 387 | 392 | 391 |

FIG. 4B
(PRIOR ART)

|     |     |     | 421 | 420 | 420 |     |     |
|-----|-----|-----|-----|-----|-----|-----|-----|
|     |     | 424 | 433 | 429 | 429 | 420 |     |
|     | 429 | 435 | 437 | 431 | 431 | 428 | 437 |
| 411 | 433 | 442 | 440 | 436 | 433 | 439 | 424 | 407 |
| 411 | 434 | 441 | 443 | 438 | 438 | 441 | 429 | 412 |
| 408 | 432 | 440 | 444 | 440 | 442 | 439 | 429 | 410 |
| 415 | 426 | 438 | 444 | 442 | 440 | 439 | 430 | 405 |
|     | 415 | 433 | 442 | 441 | 441 | 438 | 418 |
|     | 420 | 434 | 433 | 432 | 425 | 405 |
|     |     |     | N/A | 420 | 417 |

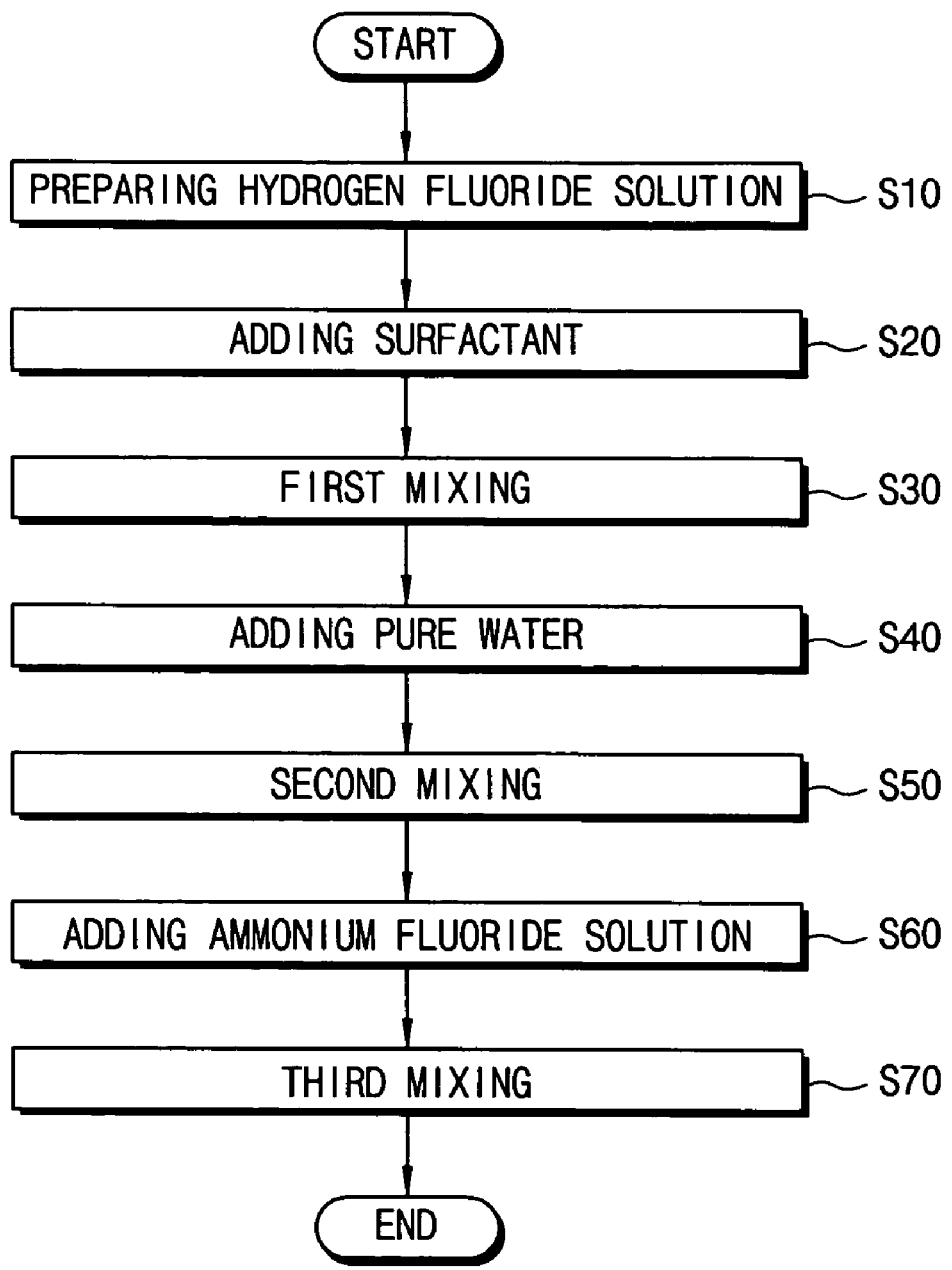

FIG. 12A

|     |     | 400 | 404 | 407 |     |
|-----|-----|-----|-----|-----|-----|
|     | 398 | 403 | 406 | 409 | 410 |
| 396 | 403 | 404 | 405 | 407 | 411 |
| 397 | 403 | 404 | 405 | 406 | 410 |
| 396 | 403 | 405 | 404 | 406 | 410 |
| 395 | 403 | 405 | 406 | 407 | 410 |
|     | 400 | 404 | 405 | 406 | 407 |
|     |     | 399 | 403 | 402 |     |

FIG. 12B

|     |     | 470 | 472 | 473 |     |
|-----|-----|-----|-----|-----|-----|
|     | 473 | 474 | 474 | 474 | 474 |
| 474 | 473 | 472 | 471 | 427 | 472 |
| 471 | 471 | 470 | 469 | 471 | 471 |
| 469 | 468 | 468 | 469 | 469 | 469 |
| 464 | 464 | 467 | 469 | 469 | 467 |
|     | 468 | 469 | 468 | 467 | 464 |
|     |     | 465 | 465 | 462 |     |

US 7,311,857 B2

ETCHING COMPOSITION, METHOD OF PREPARING THE SAME, METHOD OF ETCHING AN OXIDE FILM, AND METHOD OF MANUFACTURING A SEMICONDUCTOR DEVICE

CROSS-REFERENCE OF RELATED APPLICATIONS

A claim of priority is made to Korean Patent Application No. 2004-00235 filed on Jan. 5, 2004 and Korean Patent Application No. 2003-72692 filed on Oct. 17, 2003, the contents of which are herein incorporated by reference in their entireties.

BACKGROUND OF THE INVENTION

1. Field of the Invention

The present invention relates to etching compositions, and more particularly, the present invention relates to an etching composition having a high etching selectivity, a method of preparing the same, a method of selectively etching an oxide film, and a method of manufacturing a semiconductor device using the same.

2. Description of the Related Art

Generally, a capacitor in a semiconductor memory device, such as a DRAM or an SRAM, contains a storage electrode, a dielectric film, and a plate electrode. The dielectric film is typically made from a material having a low dielectric constant such as silicon oxide ($SiO_2$), silicon oxide/silicon nitride ($SiO_2/Si_3N_4$), and the like.

As the degree of integration of memory devices has increased to the gigabit range or more, the useable area per unit cell has decreased to the extent that problems have arisen in manufacturing the memory devices. It is particularly difficult to form a capacitor with a required capacitance of at least 25 μF/cell in the small usuable areas available in highly integrated devices.

Recently, in an effort to produce sufficient capacitance, capacitors have been manufactured to have a cylindrically shaped structure. By employing this structure, both the inner and the outer areas of the capacitor form capacitive regions. In addition, increasing the height of the storage electrode allows for an increase in capacitance without occupying additional surface area. A Hemi-Spherical Grain (HSG) layer may also be formed on the storage electrode to further increase the surface area of the capacitor, thereby further increasing capacitance.

Methods of manufacturing semiconductor memory devices having a capacitor with an HSG silicon layer are disclosed in U.S. Pat. No. 6,413,813 (issued to Jeng Erik) and U.S. Pat. No. 6,403,411 (issued to Chih-Hsun Chu et al.).

Reference is made to FIGS. 1A through 1 D, which are cross-sectional views illustrating a conventional method of manufacturing an HSG capacitor of a semiconductor memory device.

As shown in FIG. 1A, an isolation layer 15 is formed on a substrate 10 to define an active region. Then, gate structures 35 are formed on the active region of the substrate 10. Each of the gate structures 35 includes a gate electrode 20, a capping layer 25, and a spacer 25. Subsequently, source/drain regions 40 are formed by an ion implantation process between the gate structures 35. A conductive layer is deposited on the entire surface of the substrate 10 including the gate structure 35, and then the deposited conductive layer is planarized to form a contact pad 45. An interlayer dielectric (or insulating interlayer) 50 is formed on the substrate 10. The interlayer dielectric 50 is then patterned to form a contact hole to expose the contact pad 45. A conductive layer is deposited on the interlayer dielectric 50 to fill the contact hole. The conductive layer is then planarized to form a storage node contact plug 55, which is connected to the contact pad 45.

Then, as shown In FIG. 1B, an etch stop layer 60 and a lower sacrificial layer 65 are subsequently deposited on the interlayer dielectric 50 and the storage node contact plug 55. The etch stop layer 60 includes a nitride material, and the lower sacrificial layer 65 includes an oxide material such as BPSG.

On the lower sacrificial layer 65, an upper sacrificial layer 70 is formed using an oxide material such as PE-TEOS. The upper sacrificial layer 70, the lower sacrificial layer 65, and the etch stop layer 60 are subsequently etched to form a storage node contact hole 75 to expose the storage node contact plug 55.

Referring to FIG. 1C, a doped polysilicon layer is formed on the exposed storage node contact plug 55, the inner wall portion of the storage node contact hole 75, and the upper sacrificial layer 70. The doped polysilicon layer is then patterned to form a storage electrode 80 on the inner wall portion of the storage node contact hole 75 and the storage node contact plug 55. An HSG silicon layer 85 is then selectively formed on the storage electrode 80.

Then, referring to FIG. 1D, the upper sacrificial layer 70 and the lower sacrificial layer 65 are removed. Generally, this is done by a wet etching process employing an LAL etchant solution. Then, an oxide layer or a nitride layer, and conductive layer are sequentially deposited. The conductive layer, the oxide layer or the nitride layer, and the etch stopping layer 60 are subsequently patterned to form the dielectric film 90 and the upper electrode 95 covering a cell array region on the storage electrode 80, thereby completing an HSG capacitor 97.

The conventional method suffers a drawback in that the polysilicon storage electrode tends to deteriorate during formation of the HSG silicon layer. As a result, the storage electrode is susceptible to damage when the upper and the lower sacrificial layers are removed. This is explained further below.

FIG. 2 is an electron microscope image of a storage electrode after etching of an oxide sacrificial layer using a conventional LAL solution.

As seen in FIG. 2, the polysilicon storage electrode suffers damage (A) when the upper and the lower sacrificial layers are removed. This is because the polysilicon in the storage electrode crystallizes during the heat treatment used to grow the HGS silicon layer. Ammonium fluoride ($NH_4F$) ions, which are contained in the LAL etching solution used to remove the oxide sacrificial layer, readily exfoliates the crystallized polysilicon. Accordingly, damage of the storage electrode is induced.

In an effort to prevent the problems associated with the use of the LAL etching solution, a wet etching method of removing the oxide layer has been developed using an etching solution having hydrogen fluoride and de-ionized water in a mixed ratio of about 5:1.

FIG. 3 is an electron microscope picture of a storage electrode after etching of a sacrificial oxide layer using a 5:1 hydrogen fluoride solution.

Referring to FIG. 3, when the 5:1 hydrogen fluoride solution is used to remove the upper and the lower oxide sacrificial layers, the storage electrode is relatively undamaged when compared with the etching process using the LAL etching solution. However, the amount of etching dispersion on the etch stopping layer located on the substrate increases. Etching dispersion means that the etching was uneven. In addition, the amount of the nitride layer etched also increases, therefore reducing the etching margin when an over-etching occurs.

FIG. 4A is a plan view to explain the thickness (etching) dispersion of the remaining nitride layer after an etching process of a dipping technique using the conventional 5:1 hydrogen fluoride solution. FIG. 4B is a plan view to explain the thickness (etching) dispersion of the remaining nitride layer after an etching process of a circulating technique using the conventional 5:1 hydrogen fluoride solution.

Referring to FIG. 4A, a dipping-type wet etching process was implemented for about 670 seconds. The mean thickness of the nitride layer remaining on the substrate was about 419 Å. The maximum thickness thereof was about 442 Å, and the minimum thickness thereof was about 373 Å. That is, the difference between the maximum thickness and the minimum thickness of the nitride layer was about 69 Å. Therefore, it can be concluded that the wet etching process was non-uniform for the nitride layer.

Referring to FIG. 4B, a circulating-type wet etching process was implemented for about 750 seconds. The mean thickness of the nitride layer remaining on the substrate was about 405 Å. The maximum thickness thereof was about 444 Å, and the minimum thickness thereof was about 405 Å. That is, the difference between the maximum thickness and the minimum thickness of the remaining nitride layer was about 39 Å. The difference was greatly reduced compared with the dipping-type wet etching, but the wet etching process was still non-uniform for the nitride layer.

The pH of 5:1 hydrogen fluoride solution is about 1, i.e., strongly acidic. Therefore, the wet etching process is performed under a strong acid atmosphere. As a result, the nitride layer is non-uniformly etched and the dispersion of the nitride layer is high. In addition, particles exfoliated from a sloped portion or the back portion of the substrate may be adsorbed onto the surface portion of the substrate during the wet etching process so as to induce a reflow-type defect.

SUMMARY OF THE INVENTION

According to an aspect of the present invention, an etching composition includes about 0.1 to 8% by weight of hydrogen fluoride (HF), about 10 to 25% by weight of ammonium fluoride ($NH_4F$), about 0.0001 to 3% by weight of a non-ionic polymer surfactant, and water ($H_2O$).

According to another aspect of the present invention, a method of preparing an etching composition includes preparing a first mixture solution by mixing a non-ionic polymer surfactant and a hydrogen fluoride solution, and preparing a second mixture solution by mixing water and the first mixture solution. The etching composition is then prepared by mixing an ammonium fluoride solution and the second mixture solution.

According to still another aspect of the present invention, an etching method includes forming a nitride layer on a substrate, forming an oxide layer over the nitride layer; and patterning the oxide layer to form a contact hole exposing the nitride layer. A polysilicon layer pattern is then formed on the exposed nitride layer and an inner side wall portion of the contact hole, and the oxide layer is removed using an etching composition. The etching composition includes a non-ionic polymer surfactant that is selectively adsorbed on a surface portion of the polysilicon layer pattern to passivate the polysilicon layer pattern.

According to yet another aspect of the present invention, a method of manufacturing a semiconductor device includes forming an etch stop layer on a semiconductor substrate, forming a first oxide layer on the etch stop layer, forming a second oxide layer on the first oxide layer, and partially removing the first and second oxide layers to expose a contact region. A polysilicon layer pattern is then formed which contacts the contact region, and the first and second oxide layers are removed using an etching composition. The etching composition includes a non-ionic polymer surfactant that is selectively adsorbed on a surface portion of the polysilicon layer pattern to passivate the polysilicon layer pattern.

BRIEF DESCRIPTION OF THE DRAWINGS

The above aspects and advantages of the present invention will become more apparent from the detailed description that follows, with reference to the accompanying drawings, in which:

FIGS. 4A and 4B are plan views representing the thickness dispersion of the remaining nitride layer after a dipping-type etching process and a circulating-type etching process, respectively, using a conventional 5:1 hydrogen fluoride solution;

FIG. 6 is a flow chart illustrating a method of preparing an etching composition according to an embodiment of the present invention;

FIGS. 12A and 12B are plan views representing the thickness dispersion of the remaining nitride layer after a dipping-type etching process and a circulating-type etching process, respectively, using an etching composition according to an embodiment of the present invention.

DESCRIPTION OF THE INVENTION

Figure 1A:
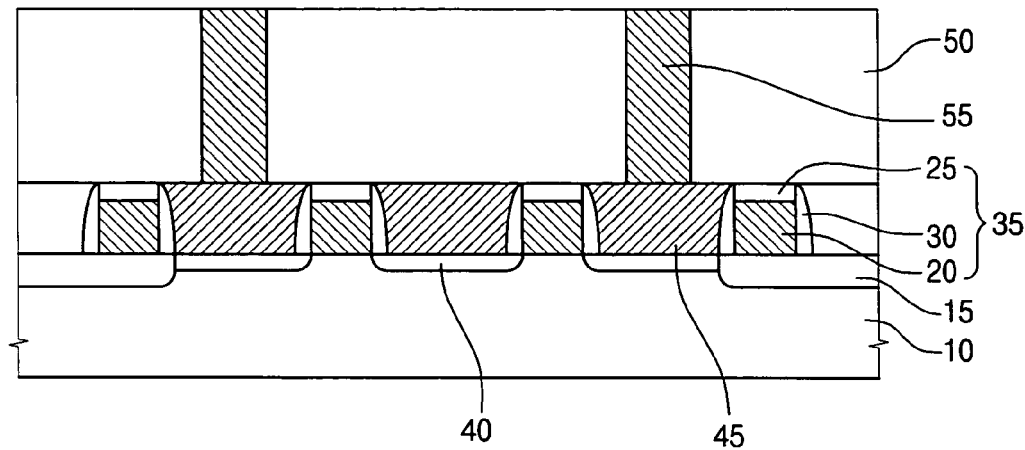
FIGS. 1A to 1D are cross-sectional views illustrating a method of manufacturing a conventional semiconductor memory device having HSG capacitors.
Figure 1B:
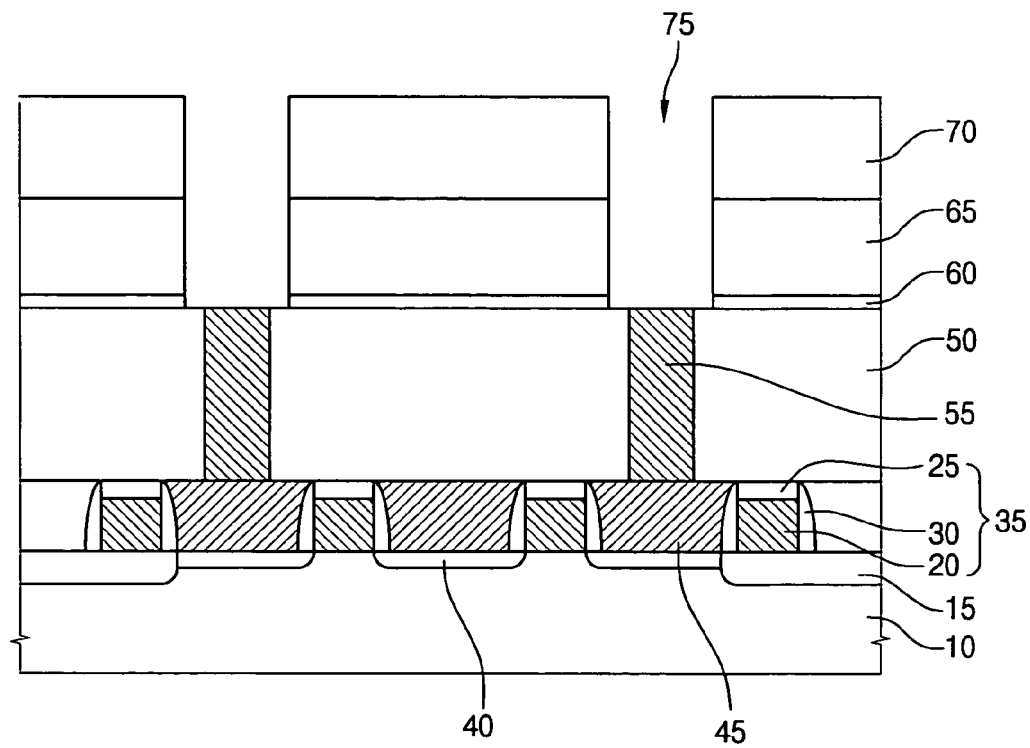
Figure 1C:
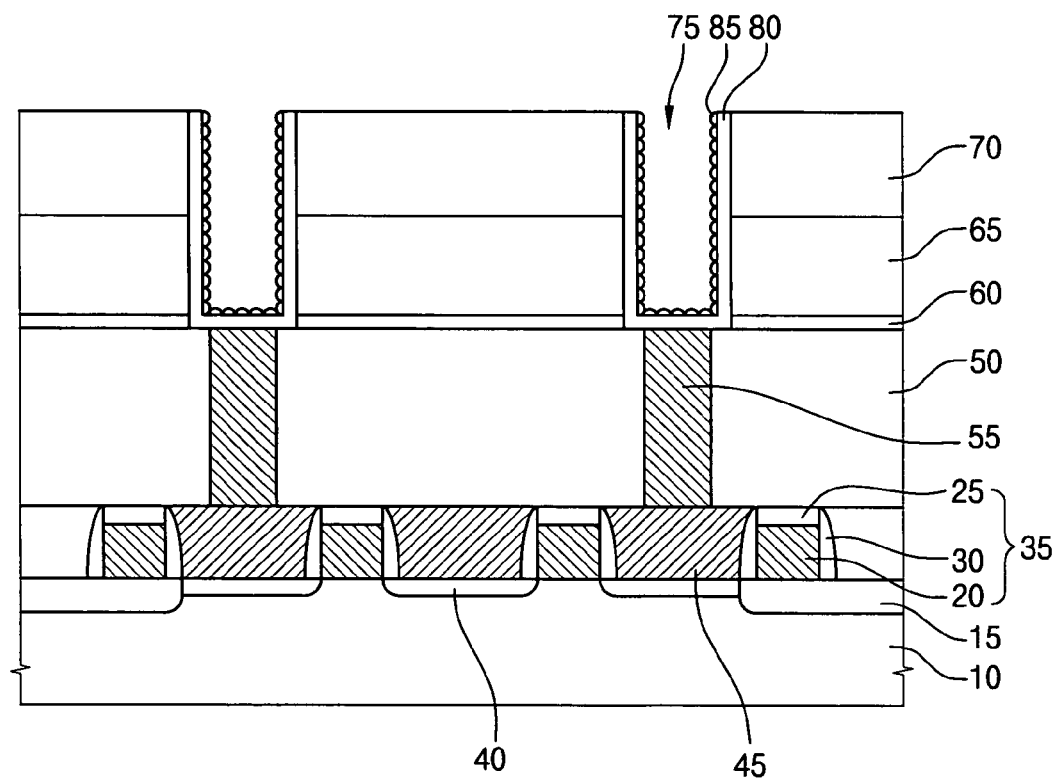
Figure 1D:
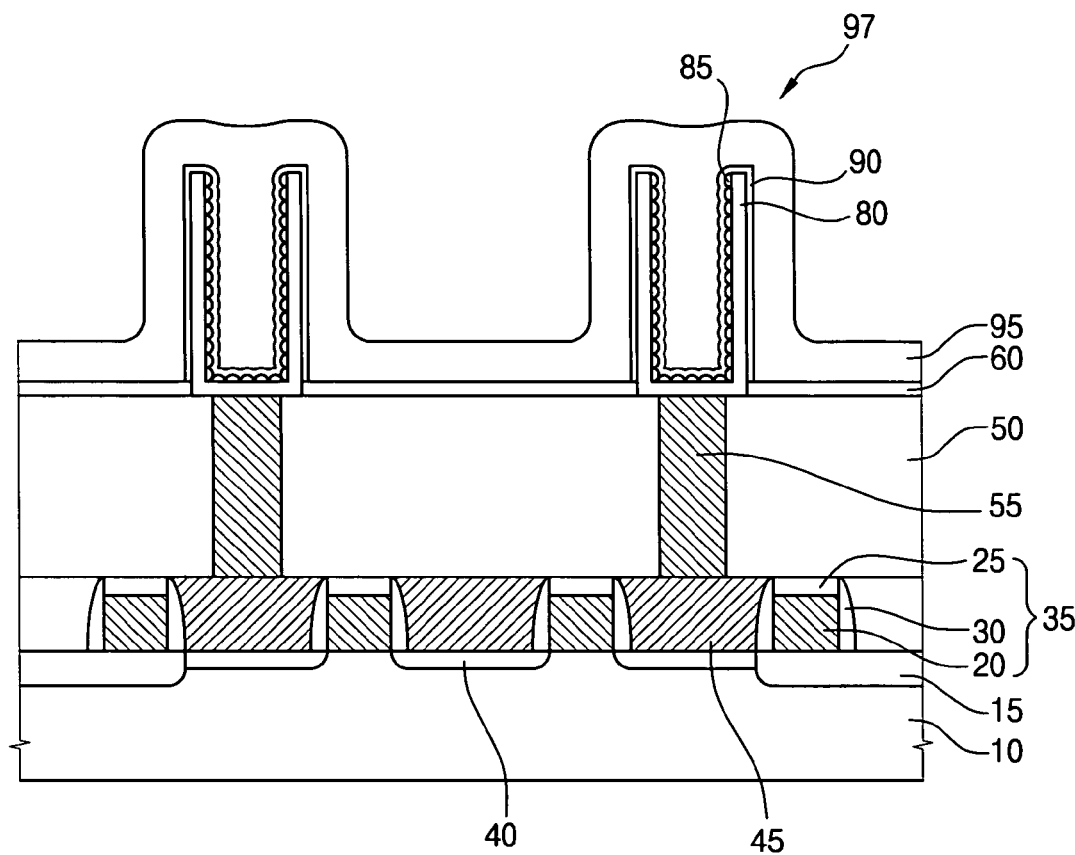
Figure 2:
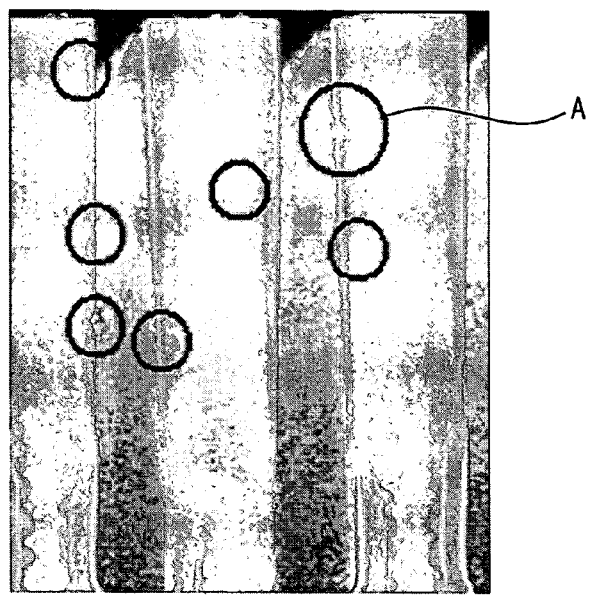
FIG. 2 is an image taken by an electron microscope of a storage electrode after an etching process of an oxide layer using a conventional LAL solution.
Figure 3:
FIG. 3 is an image taken by an electron microscope of a storage electrode after an etching process of an oxide layer using a conventional 5:1 hydrogen fluoride solution.

The present invention is described below with reference to several preferred but non-limiting embodiments. These embodiments relate to an etching composition, a method of preparing an etching composition, a method of etching, and a method of manufacturing a semiconductor device.

Etching Composition

An etching composition according to an embodiment of the present invention includes hydrogen fluoride, ammonium fluoride, a non-ionic polymer surfactant, and water.

A hydrogen fluoride (HF) solution having a concentration of about 40 to 60% by weight may be used to prepare the etching composition. The amount of hydrogen fluoride contained in the etching composition is preferably in the range of about 0.1 to about 8% by weight.

An ammonium fluoride ($NH_4F$) solution having a concentration of about 30 to 50% by weight may be used to prepare the etching solution. The amount of the ammonium fluoride contained in the etching composition is preferably in a range of about 10 to about 25% by weight.

When the amount of non-ionic polymer surfactant is less than about 0.0001% by weight, the prevention of defects due to the back adsorption of particles may be insufficient, and when the amount of surfactant exceeds about 3% by weight, the improvement in preventing defects may be trivial. Therefore, the amount of the non-ionic polymer surfactant is preferably in a range of about 0.0001 to about 3% by weight based on a total amount of the composition, and more preferably in a range of about 0.001 to about 0.02% by weight.

The non-ionic polymer surfactant may include a non-ionic polymer having both properties of hydrophilicity and hydrophobicity (that is, the non-ionic polymer has both hydrophilic and hydrophobic groups).

Examples of the non-ionic polymer surfactant include a block copolymer of polyethylene glycol and polypropylene glycol (alternately referred to as "ethylene glycol/propylene glycol block copolymer" which is a block copolymer having oxyethylene and oxypropylene chains and which is manufactured by copolymerizing ethylene glycol and propylene glycol monomers), a random copolymer of polyethylene glycol and polypropylene glycol (alternately referred to as "ethylene glycol/propylene glycol random copolymer" which is a random copolymer having oxyethylene and oxypropylene and which is manufactured by copolymerizing ethylene glycol and propylene glycol monomers), a block copolymer of polyethylene oxide and polypropylene oxide (alternately referred to as "ethylene oxide/propylene oxide block copolymer" which is a block copolymer having oxyethylene and oxypropylene chains and which is manufactured by copolymerizing ethylene oxide and propylene oxide monomers), or a random copolymer of polyethylene oxide and polypropylene oxide (alternately referred to as "ethylene oxide/propylene oxide random copolymer" which is a random copolymer having oxyethylene and oxypropylene chains and which is manufactured by copolymerizing ethylene oxide and propylene oxide monomers).

Preferably, the non-ionic polymer surfactant has a following structure:

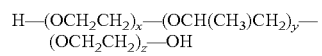

where x, y, and z are positive integers, and a weight average molecular weight of about 3,000 or less.

The block copolymer of polyethylene glycol and polypropylene glycol, having the above-mentioned structure includes commercially available Synperonic PE/L64 or Synperonic PE/L61, manufactured by FLUKA Co. in Germany. Synperonic PE/L64 or Synperonic PE/L61 is an alcohol-based purifying and washing dispersant, and produces a small amount of by-products, thereby being environmentally friendly and having good wettability. Synperonic PE/L64 has a molecular weight of about 2,900 or less and a density of about 1.05 g/ml. Synperonic PE/L61 has a molecular weight of about 2,000 or less and a density of about 1.02 g/ml.

Alternatively, the non-ionic polymer surfactant may include a poly-alcoholic non-ionic polymer surfactant. Examples of the poly-alcoholic non-ionic surfactant include poly-alcoholic mono- and di-ester, oxy-ethylene additives thereof, aliphatic alkanol amide, an oxy-ethylene additive thereof, and the like. Examples of the poly-alcohol may include glycerin, penta-erythritol, sorbitan, etc.

Oxy-ethylene additives of sorbitan ester may be used as a preferable poly-alcoholic non-ionic surfactant. When sorbit and aliphatic acid are heated with a catalyst such as sodium hydroxide, sorbit is dehydrated to produce sorbitan. The thusly formed sorbitan is reacted with the aliphatic acid to produce an ester compound.

A structure of polysorbate 80 is illustrated as an example of sorbitan ester as follows:

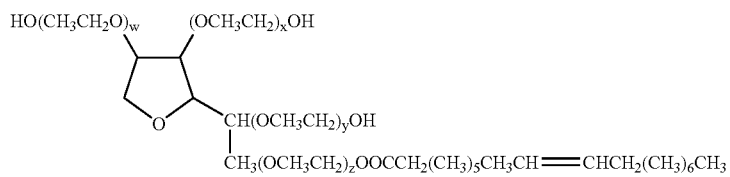

where w, x, y and z are positive integers.

Chemical structures of the above-mentioned compounds are illustrated as chemical formulae as follows:

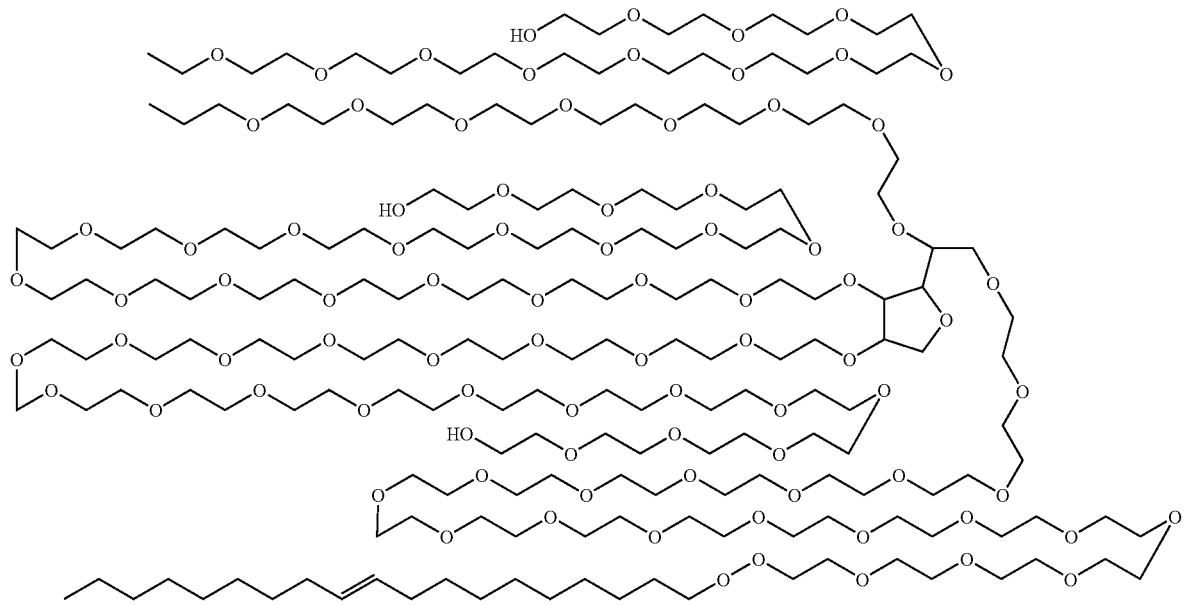

Oxy-ethylene additives of sorbitan ester including polysorbate 60, polysorbate 65, and the like may also be used in embodiments of the present invention.

A mechanism for passivating a polysilicon layer by the non-ionic polymer during selective etching of an oxide layer will be described hereinafter.

Figure 5A:
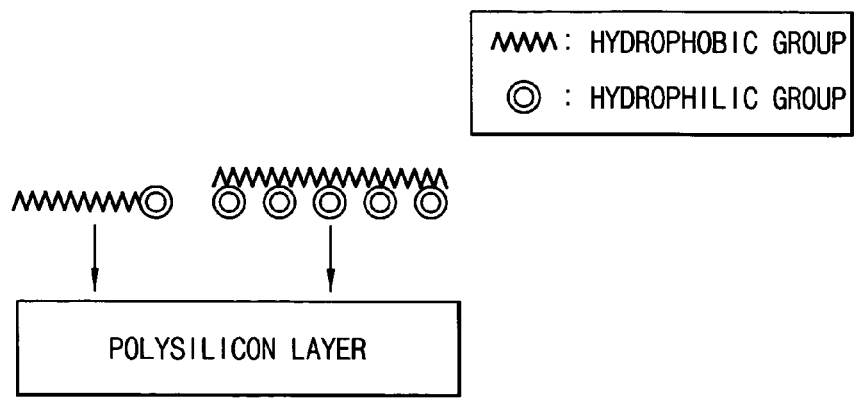
FIGS. 5A and 5B are schematic cross-sectional views illustrating a mechanism of passivating a polysilicon layer by an etching composition according to an embodiment of the present invention.
Figure 5B:
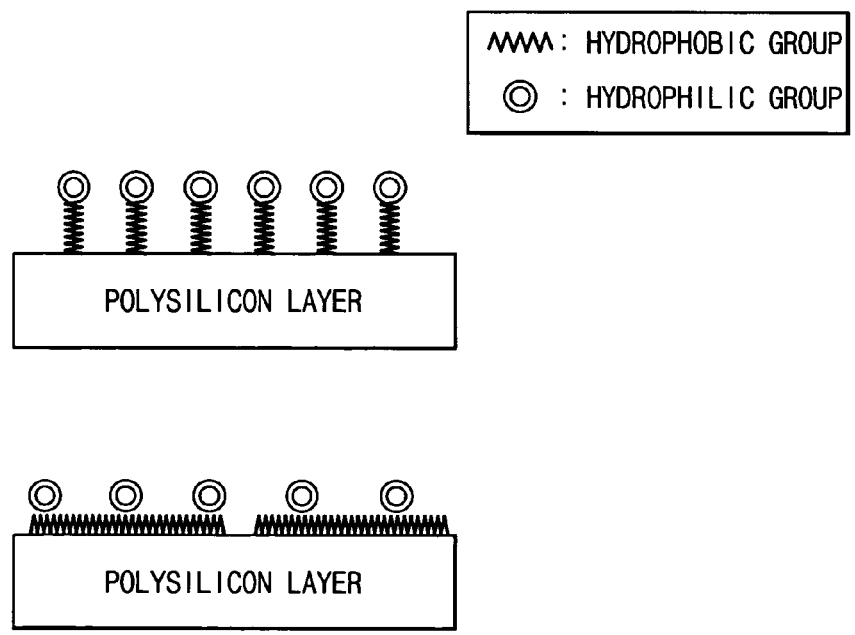

FIGS. 5A and 5B are schematic cross-sectional views for explaining the mechanism of passivating a polysilicon layer by an etching composition of an embodiment of the present invention.

In FIG. 5A, when an non-ionic polymer having both hydrophobic and hydrophilic groups is added as a surfactant into a solution including ammonium fluoride, hydrogen fluoride, and water, the non-ionic polymer is selectively adsorbed on the surface of the polysilicon layer as shown in FIG. 5B. The absorption of the surfactant helps protect the polysilicon layer during subsequent wet etching of the oxide layer. That is, when the oxide layer is selectively etched, damage to the polysilicon layer is minimized or avoided due to the presence of the non-ionic polymer. Further, an etching uniformity of the nitride layer is obtained.

Preparation of Etching Composition

FIG. 6 is a flow chart illustrating a method of preparing an etching composition according to an embodiment of the present invention.

Referring to FIG. 6, in step S10, a hydrogen fluoride (HF) solution having a concentration of about 50% by weight and a final concentration of about 0.1 to 8% by weight is added into a container. Then in step S20, about 0.0001 to 3% by weight, preferably, about 0.001 to 0.02% by weight of a surfactant is added into the hydrogen fluoride solution. In step S30, the thusly obtained mixture of the hydrogen fluoride solution and the surfactant is stirred for about 3 hours or more to homogeneously mix the solution so as to prepare a first mixture solution (this step is referred to as a first mixing step).

In step S40, into the first mixture solution, a predetermined amount of water ($H_2O$) is added. In step S50, the thusly obtained mixture is stirred for about 3 hours or more to homogeneously mix the first mixture solution with water to prepare a second mixture solution (this step is referred to as a second mixing step).

In step S60, into the second mixture solution, an ammonium fluoride solution having a concentration of about 40% by weight is added so that a final concentration of ammonium fluoride is about 10 to 25% by weight. In step S70, the second mixture solution and the ammonium fluoride solution are uniformly stirred for about 12 hours or more to obtain a homogeneously mixed etching composition (this step is referred to as a third mixing step).

A circulating pump and a filter are connected to the container to circulate and filter particles in the first mixture solution, the second mixture solution, and the etching composition. During the preparation of the first mixture solution, the second mixture solution, and the etching composition, all the solutions and the etching composition are maintained at a temperature of about 10 to about 40° C.

If each of the components are not added and stirred as described above, ammonium fluoride may potentially react with hydrogen fluoride to produce crystals of $NH_4FHF_2$, thereby producing an etching composition not having desired properties.

EXAMPLE 1

A hydrogen fluoride (HF) solution having a concentration of about 50% by weight was added into a container, and then a trace amount of a surfactant was added into the container having the hydrogen fluoride solution. As the surfactant, commercially available Synperonic PE/L64 manufactured by FLUKA Co. in Germany was used. The hydrogen fluoride solution including the surfactant was stirred for more than 3 hours to prepare a first mixture solution. Into the first mixture solution water ($H_2O$) was added. The water and the first mixture solution were stirred again for more than 3 hours to obtain a homogeneously mixed second mixture solution.

Into the second mixture solution, an ammonium fluoride ($NH_4F$) solution having a concentration of about 40% by weight was added so that a final concentration of the ammonium fluoride was about 10 to 25% by weight. The second mixture solution and the ammonium fluoride solution were stirred for more than 12 hours to prepare a homogeneously mixed etching composition.

A circulating pump and a filter were connected to the container to circulate and filter particles in the first mixture solution, the second mixture solution, and the etching composition. During the preparation of the first mixture solution, the second mixture solution, and the etching composition, the solutions were maintained at a temperature of about 10 to about 40° C.

An etching composition containing ammonium fluoride of about 18% by weight, hydrogen fluoride of about 4.5% by weight, and the non-ionic polymer surfactant of about 0.001 to 0.02% by weight was obtained.

EXAMPLE 2

An etching composition was prepared in the same manner as described in Example 1, except that Synperonic PE/L64 and polysorbate 80 were used as a surfactant instead of Synperonic PE/L64. The obtained etching composition contained ammonium fluoride of about 18% by weight and hydrogen fluoride of about 4.5% by weight, and a non-ionic surfactant, Synperonic PE/L64 of about 10 ppm and polysorbate 80 of about 200 ppm.

EXAMPLE 3

An etching composition was prepared in the same manner as described in Example 1, except that polysorbate 80 was used as the surfactant instead of Synperonic PE/L64. The obtained etching composition contained ammonium fluoride of about 18% by weight and hydrogen fluoride of about 4.5% by weight, and as a non-ionic surfactant, polysorbate 80 of about 200 ppm.

COMPARATIVE EXAMPLE 1

An etching composition was prepared by mixing hydrogen fluoride (HF) with deionized water (D.I. water) in a mixing ratio of about 5:1.

COMPARATIVE EXAMPLE 2

An etching composition (LAL 500 aqueous solution) was prepared by mixing about 40% by weight of ammonium fluoride, about 50% by weight of hydrogen fluoride and deionized water, in a mixing ratio of about 5:1:5, and then, adding the same molar ratio of $C_8H_{17}NH_2$ and $C_9H_{19}COOH$ to adjust the concentration of a surfactant to about 200 ppm.

COMPARATIVE EXAMPLE 3

An etching composition was prepared by adding the same molar ratio of $C_8H_{17}NH_2$ and $C_9H_{19}COOH$ into the etching composition of Comparative Example 1 to adjust the concentration of the surfactant to about 200 ppm.

COMPARATIVE EXAMPLE 4

An etching composition was prepared in the same manner as described in Comparative Example 2, except that a surfactant was not added.

Etching Oxide Layer

Figure 7A:
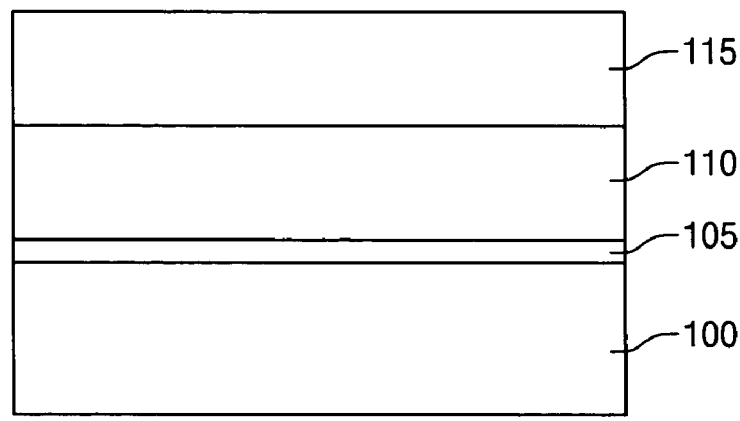
FIGS. 7A to 7C are cross-sectional views illustrating a method of selectively etching an oxide layer among an oxide layer, a nitride layer, and a polysilicon layer by using an etching composition according to an embodiment of the present invention.
Figure 7B:
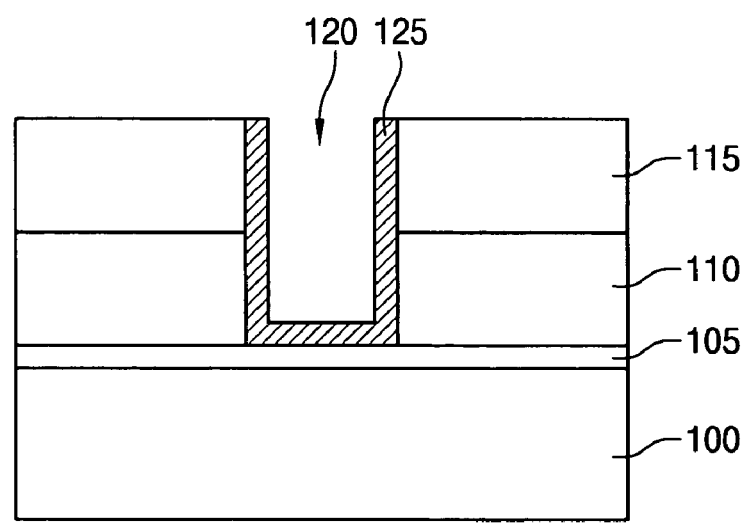
Figure 7C:
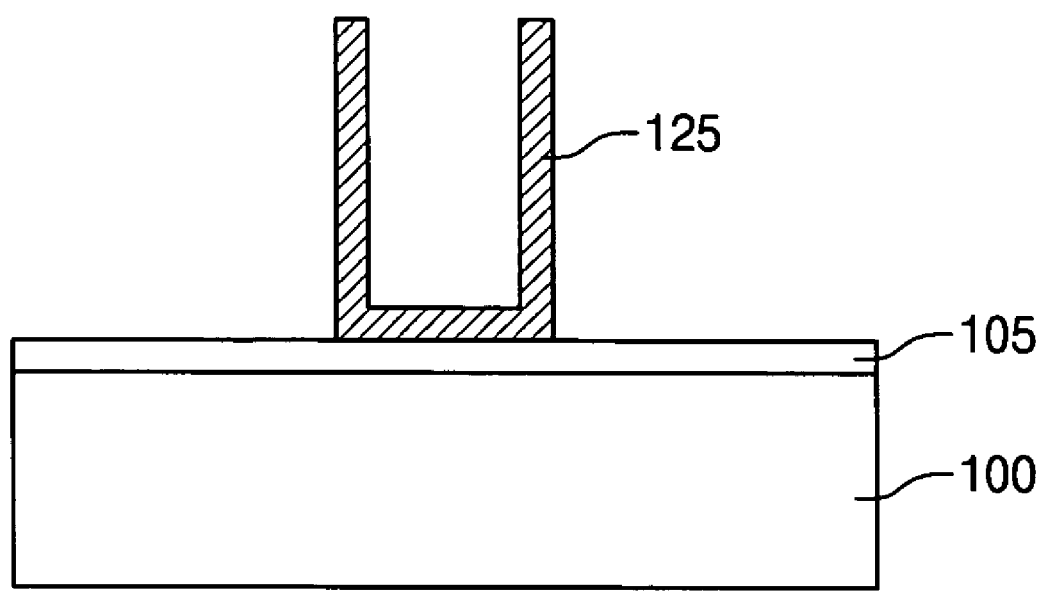

FIGS. 7A to 7C are cross-sectional views illustrating a method of selectively etching an oxide layer among an oxide layer, a nitride layer and a polysilicon layer by using the etching composition according to the present invention. In FIGS. 7A to 7C, underlying structures between a substrate and a nitride layer are not shown or described for the sake of brevity.

Referring to FIG. 7A, a nitride layer 105, a first oxide layer 110 and a second oxide layer 115 are sequentially formed on a substrate 100 such as a silicon wafer. In this example, the nitride layer 105 is formed using silicon nitride (SiN), the first oxide layer 110 is formed using BPSG, and the second oxide layer 115 is formed using PE-TEOS.

Referring to FIG. 7B, the second oxide layer 115 and the first oxide layer 110 are partially etched to form a contact hole 120 for exposing the nitride layer 105 by photolithography. After a polysilicon layer is formed on the exposed nitride layer 105 through the contact hole 120 and on the inner side wall of the contact hole 120 and the second oxide layer 115, the polysilicon layer is patterned to form a polysilicon layer pattern 125.

Referring to FIG. 7C, the second oxide layer 115 and the first oxide layer 110 are etched by a wet etching process using the above-described etching composition according to an embodiment of the present invention. Upper portions of the nitride layer 105 on the substrate 100 are also partially etched. Here, since the etching composition of the embodiment includes a non-ionic polymer that is adsorbed on a surface portion of the polysilicon layer pattern 125 to passivate the polysilicon layer pattern 125, damage of the polysilicon layer pattern 125 during etching the first and the second oxide layers 110 and 115 may be significantly reduced. In addition, the etching uniformity on the nitride layer 105 is improved when compared with the conventional LAL or 5:1 hydrogen fluoride etching solution. The etching result on the nitride layer 105, the first and the second oxide layers 110 and 115, and the polysilicon layer pattern 125 after the etching process will be described below.

Etching Experiment 1

Figure 8A:
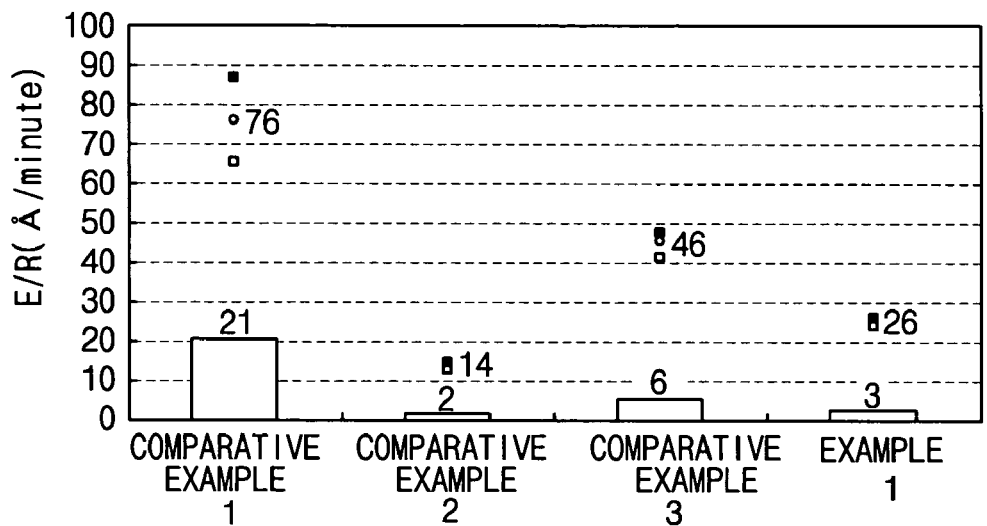
FIGS. 8A to 8D are graphs illustrating an etching rate for a PE-TEOS layer, a BPSG layer, a silicon nitride layer, and a polysilicon layer by a wet etching process using an etching composition obtained according to Example 1 of the present invention and etching compositions obtained according to Comparative Examples 1 to 3.
Figure 8B:
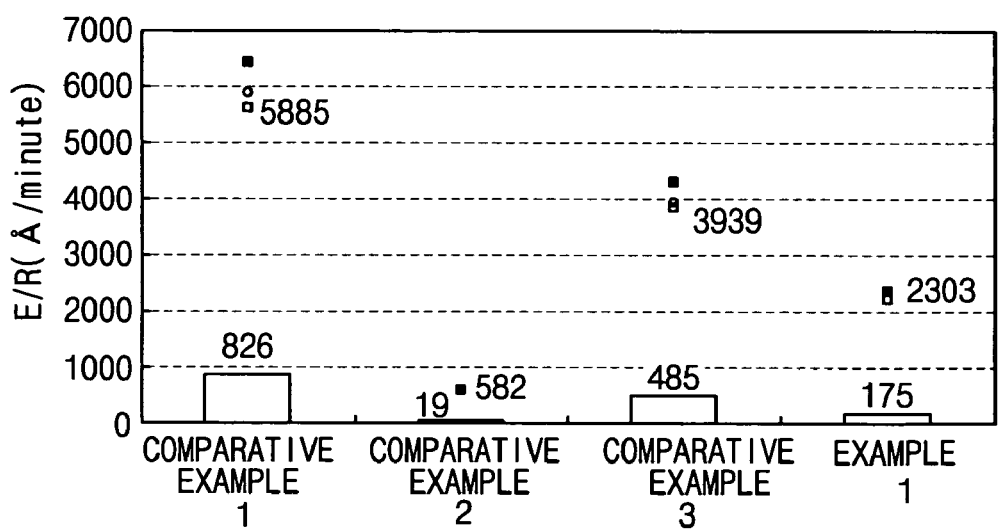
Figure 8C:
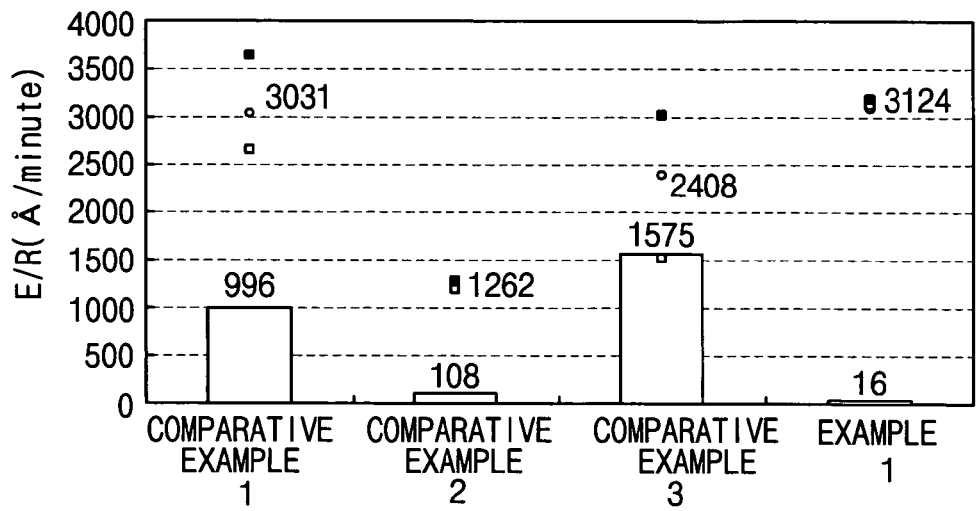

FIGS. 8A to 8D are graphs illustrating the etching rate for a PE-TEOS layer, a BPSG layer, a silicon nitride (SiN) layer, and a polysilicon layer by a wet etching process using an etching composition obtained according to Example 1 of the present invention, and etching compositions obtained according to Comparative Examples 1 to 3. FIG. 8A corresponds to an etching result of the silicon nitride layer; FIG. 8B corresponds to an etching result of the BPSG layer; FIG. 8C corresponds to an etching result of the PE-TEOS layer; and FIG. 8D corresponds to an etching result of the polysilicon layer.

Referring to FIG. 8A, a mean etching rate for the silicon nitride layer during the etching of the PE-TEOS layer and the BPSG layer by a wet etching process using the etching composition of Example 1 was about 26 Å/minute. A maximum etching rate thereof was about 27 Å/minute, and a minimum etching rate thereof was about 24 Å/minute. Therefore, an etching rate dispersion was only about 3 Å/minute.

In contrast, when the hydrogen fluoride etching solution according to Comparative Example 1 was used, the mean etching rate for the silicon nitride layer was about 76 Å/minute. The maximum etching rate thereof was about 86 Å/minute, and the minimum etching rate thereof was about 65 Å/minute. Therefore, the etching rate dispersion was about 21 Å/minute.

When the LAL 500 etching solution according to Comparative Example 2 was used, the mean etching rate for the nitride layer was about 14 Å/minute. The maximum etching rate thereof was about 15 Å/minute, and the minimum etching rate thereof was about 13 Å/minute. Therefore, the etching rate dispersion was about 2 Å/minute, which is very low.

When the etching composition according to Comparative Example 3 was used, the mean etching rate for the nitride layer was about 46 Å/minute. The maximum etching rate thereof was about 49 Å/minute, and the minimum etching rate thereof was about 43 Å/minute. Therefore, the etching rate dispersion was about 6 Å/minute.

Therefore, an etching uniformity of the silicon nitride layer during the etching of the PE-TEOS layer and the BPSG layer by using the etching composition according to Example 1 was greatly improved when compared with conventional etching compositions.

Referring to FIG. 8B, a mean etching rate for the BPSG layer by a wet etching process using the etching composition according to Example 1 was about 2,303 Å/minute. The maximum etching rate thereof was about 2,390 Å/minute, and the minimum etching rate was about 2,215 Å/minute. Therefore, the etching rate dispersion was about 175 Å/minute.

When the hydrogen fluoride etching solution according to Comparative Example 1 was used, the mean etching rate for the BPSG layer was about 5,885 Å/minute. The maximum etching rate thereof was about 6,298 Å/minute, and the minimum etching rate thereof was about 5,472 Å/minute. Therefore, the etching rate dispersion was about 826 Å/minute. That is, the etching rate for the BPSG layer increased while the etching uniformity of the BPSG layer greatly decreased.

When the LAL 500 etching solution according to Comparative Example 2 was used, the mean etching rate for the BPSG layer was about 582 Å/minute. The maximum etching rate thereof was about 591 Å/minute, and the minimum etching rate thereof was about 572 Å/minute. Therefore, the etching rate dispersion was about 19 Å/minute, which is very small. Although the etching uniformity for the BPSG layer can be obtained, the etching rate is greatly lowered when the conventional LAL 500 etching solution is used.

When the etching composition according to Comparative Example 3 was used, the mean etching rate for the BPSG layer was about 3,939 Å/minute. The maximum etching rate thereof was about 4,181 Å/minute, and the minimum etching rate thereof was about 3,696 Å/minute. Therefore, the etching rate dispersion was about 485 Å/minute. Although sufficient etching rate for the BPSG layer can be obtained, the etching uniformity of the BPSG layer is lowered.

Therefore, the BPSG layer is etched with an appropriate etching rate while having the etching uniformity compared with conventional etching composition when the etching composition according to an embodiment of the present invention is applied.

Referring to FIG. 8C, a mean etching rate for the PE-TEOS layer by a wet etching process using the etching composition according to Example 1 was about 3,124 Å/minute The maximum etching rate thereof was about 3,132 Å/minute, and the minimum etching rate thereof was about 3,116 Å/minute. Therefore, the etching rate dispersion was about 16 Å/minute, which is very low.

When the hydrogen fluoride etching solution according to Comparative Example 1 was used, the mean etching rate for the PE-TEOS layer was about 3,031 Å/minute. The maximum etching rate thereof was about 3,529 Å/minute, and the minimum etching rate thereof was about 2,533 Å/minute. Therefore, the etching rate dispersion was about 996 Å/minute. That is, the etching rate for the PE-TEOS layer decreased while the etching uniformity for the PE-TEOS layer greatly decreased when the conventional 5:1 hydrogen fluoride etching solution was used.

When the LAL 500 etching solution according to Comparative Example 2 was used, the mean etching rate for the PE-TEOS layer was about 1,262 Å/minute. The maximum etching rate thereof was about 1,316 Å/minute, and the minimum etching rate thereof was about 1,208 Å/minute. Therefore, the etching rate dispersion was about 108 Å/minute, which is very low. Although the etching uniformity for the PE-TEOS layer can be obtained, the etching rate is greatly lowered when the conventional LAL 500 etching solution is used.

When the etching composition according to Comparative Example 3 was used, the mean etching rate for the PE-TEOS layer was about 2,408 Å/minute. The maximum etching rate thereof was about 3,195 Å/minute, and the minimum etching rate thereof was about 1,620 Å/minute. Therefore, the etching rate dispersion was about 1,575 Å/minute. Although a high etching rate for the PE-TEOS layer can be obtained, the etching uniformity of the PE-TEOS layer is lowered when the conventional LAL 500 etching solution was used.

Therefore, when the PE-TEOS layer was etched by using the etching composition according to Example 1 of the present invention, a good etching rate and an appropriate etching uniformity was obtained.

Figure 8D:
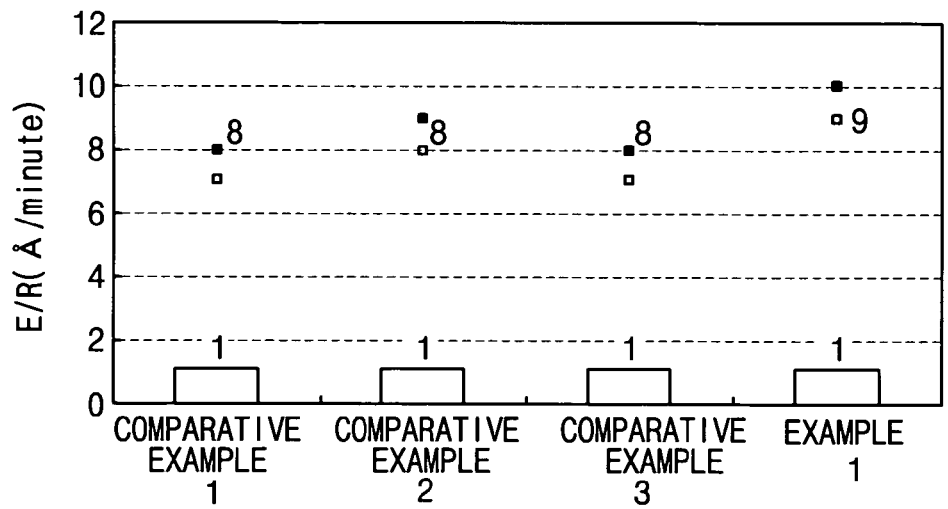

Referring to FIG. 8D, the mean etching rate for the polysilicon layer during etching the PE-TEOS layer and the BPSG layer by a wet etching process using the etching composition of Example 1 was about 9 Å/minute. The maximum etching rate thereof was about 9.8 Å/minute, and the minimum etching rate thereof was about 8.8 Å/minute. Therefore, the etching rate dispersion was only about 1 Å/minute. That is, the polysilicon layer was appropriately passivated during the etching process.

When the hydrogen fluoride etching solution according to Comparative Example 1 was used, the mean etching rate for the polysilicon layer was about 8 Å/minute. The maximum etching rate thereof was about 8.4 Å/minute, and the minimum etching rate thereof was about 7.5 Å/minute. Therefore, the etching rate dispersion was about 1 Å/minute.

When the LAL 500 etching solution according to Comparative Example 2 was used, the mean etching rate for the polysilicon layer was about 8 Å/minute. The maximum etching rate thereof was about 8.5 Å/minute, and the minimum etching rate thereof was about 7.5 Å/minute. Therefore, the etching rate dispersion was about 1 Å/minute, which is very low.

When the etching composition according to Comparative Example 3 was used, the mean etching rate for the polysilicon layer was about 8 Å/minute. The maximum etching rate thereof was about 8.4 Å/minute, and the minimum etching rate thereof was about 7.5 Å/minute. Therefore, the etching rate dispersion was about 1.

As illustrated in FIGS. 8A to 8D, the polysilicon layer may be effectively passivated during etching the oxide layers such as the PE-TEOS layer and the BPSG layer by using the etching composition according to Example 1 of the present invention. In addition, the etching uniformity of the oxide layer and the nitride layer may also be sufficiently obtained.

Etching Experiment 2

Figure 9A:
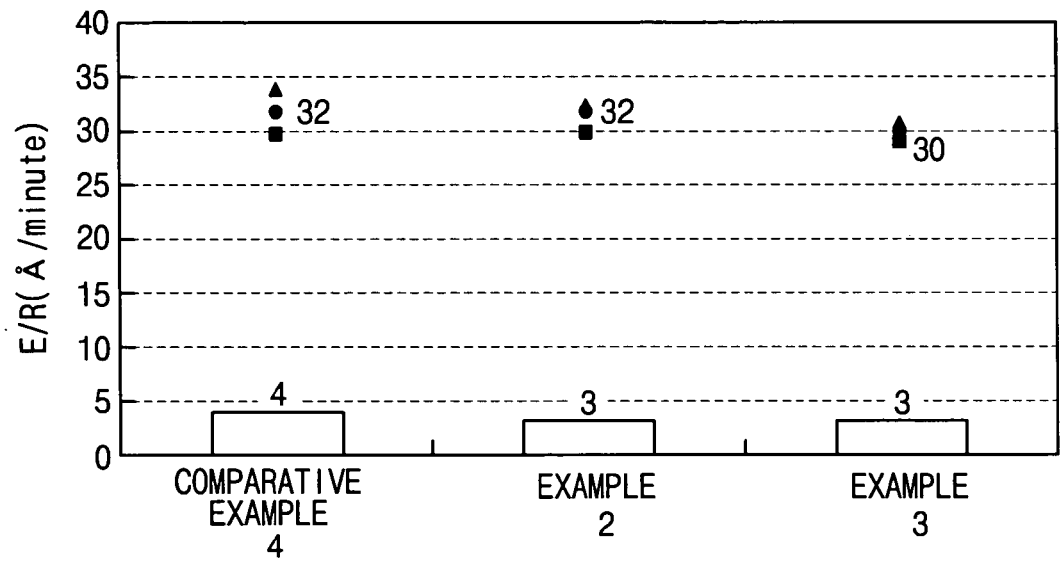
FIGS. 9A to 9D are graphs illustrating an etching rate for a PE-TEOS layer, a BPSG layer, a silicon nitride layer, and a polysilicon layer by a wet etching process using etching compositions obtained according to Examples 2 and 3 of the present invention and an etching composition obtained according to Comparative Example 4.
Figure 9B:
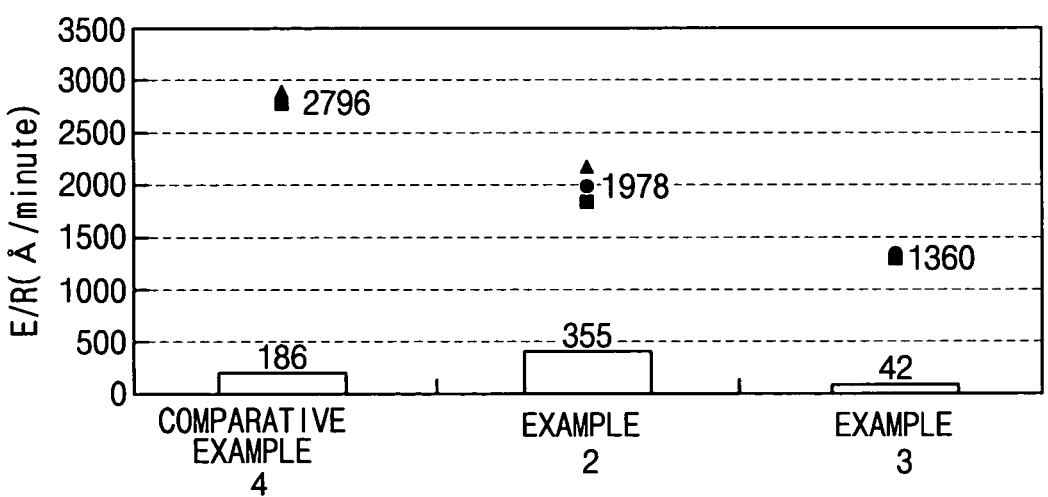
Figure 9C:
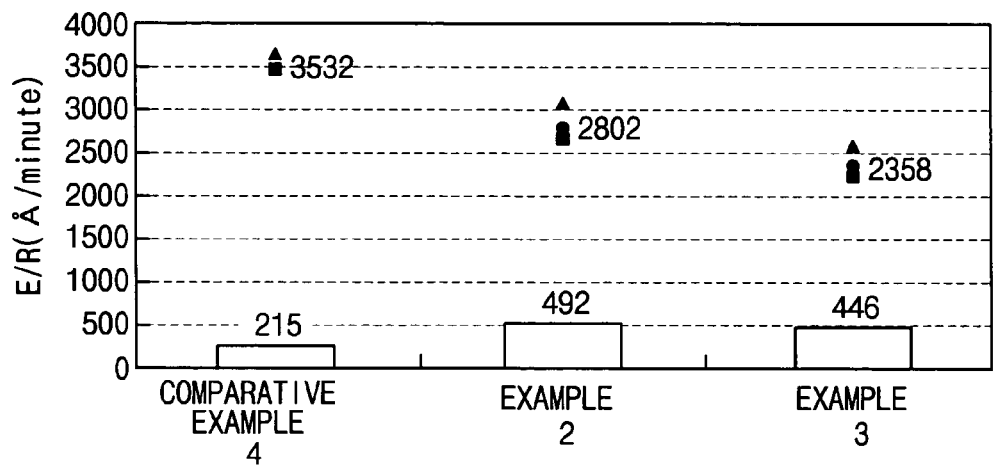

FIGS. 9A to 9D are graphs illustrating an etching rate for a PE-TEOS layer, a BPSG layer, a silicon nitride layer, and a polysilicon layer by a wet etching process using an etching composition obtained according to Examples 2 and 3 of the present invention and an etching composition obtained according to Comparative Example 4. FIG. 9A corresponds to an etching result of the silicon nitride layer; FIG. 9B corresponds to an etching result of the BPSG layer; FIG. 9C corresponds to an etching result of the PE-TEOS layer; and FIG. 9D corresponds to an etching result of the polysilicon layer.

Referring to FIG. 9A, a mean etching rate for the silicon nitride layer during etching the PE-TEOS layer and the BPSG layer by a wet etching process using the etching composition according to Example 2 was about 32 Å/minute. The maximum etching rate thereof was about 33 Å/minute, and the minimum etching rate thereof was about 30 Å/minute. Therefore, the etching rate dispersion was just about 3 Å/minute.

When the etching composition according to Example 3 was used, the mean etching rate for the silicon nitride layer was about 30 Å/minute. The maximum etching rate thereof was about 32 Å/minute, and the minimum etching rate thereof was about 29 Å/minute. Therefore, the etching rate dispersion also was about 3 Å/minute, which is very low.

When the etching composition according to Comparative Example 4 was used, the mean etching rate for the silicon nitride layer was about 32 Å/minute. The maximum etching rate thereof was about 34 Å/minute, and the minimum etching rate thereof was about 30 Å/minute. Therefore, the etching rate dispersion was only about 4 Å/minute.

Therefore, when the etching composition according to Examples of the present invention was used to etch the PE-TEOS and the BPSG oxide layers, the etching uniformity of the silicon nitride layer during etching was enhanced when compared with conventional etching solutions.

Referring to FIG. 9B, a mean etching rate for the BPSG layer during the wet etching process using the etching composition according to Example 2 was about 1,978 Å/minute. The maximum etching rate thereof was about 2,155 Å/minute, and the minimum etching rate was about 1,800 Å/minute. Therefore, the etching rate dispersion was about 355 Å/minute.

When the etching composition according to Example 3 was used, the mean etching rate for the BPSG layer was about 1,360 Å/min. The maximum etching rate thereof was about 1,381 Å/min, and the minimum etching rate thereof was about 1,339 Å/min. Therefore, the etching rate dispersion was about 42 Å/minute. When the etching composition according to Example 3 was used, the etching rate for the BPSG layer decreased. However, the etching uniformity of the BPSG layer was greatly improved.

When the etching composition according to Comparative Example 4 was used, the mean etching rate for the BPSG layer was about 2,796 Å/minute. The maximum etching rate thereof was about 2,889 Å/minute, and the minimum etching rate thereof was about 2703 Å/minute. Therefore, the etching rate dispersion was about 186 Å/minute, which is very low.

Therefore, when the etching composition of Examples 2 and 3 according to the present invention was used for etching the BPSG layer, the etching rate was lowered when compared with the etching composition in which a surfactant was not included as in Comparative Example 4.

Referring to FIG. 9C, a mean etching rate for the PE-TEOS layer by a wet etching process using the etching composition according to Example 2 was about 2,802 Å/minute. The maximum etching rate thereof was about 3,048 Å/minute, and a minimum etching rate thereof was about 2,556 Å/minute. Therefore, the etching rate dispersion was about 492 Å/minute.

When the etching composition according to Example 3 was used, the mean etching rate for the PE-TEOS layer was about 2,358 Å/minute. The maximum etching rate thereof was about 2,581 Å/minute, and the minimum etching rate thereof was about 2,135 Å/minute. Therefore, the etching rate dispersion was about 446 Å/minute.

When the etching composition according to Comparative Example 4 was used, the mean etching rate for the PE-TEOS layer was about 3,532 Å/minute. The maximum etching rate thereof was about 3,639 Å/minute, and the minimum etching rate thereof was about 3,424 Å/min. Therefore, the etching rate dispersion was about 215 Å/minute, which is very low. When the PE-TEOS layer is etched using the etching composition according to Comparative Example 4, etching uniformity can be obtained. However, the etching rate is excessively low.

Therefore, when the PE-TEOS layer is etched using the etching composition according to an embodiment of the present invention, an appropriate etching uniformity is obtained.

Figure 9D:
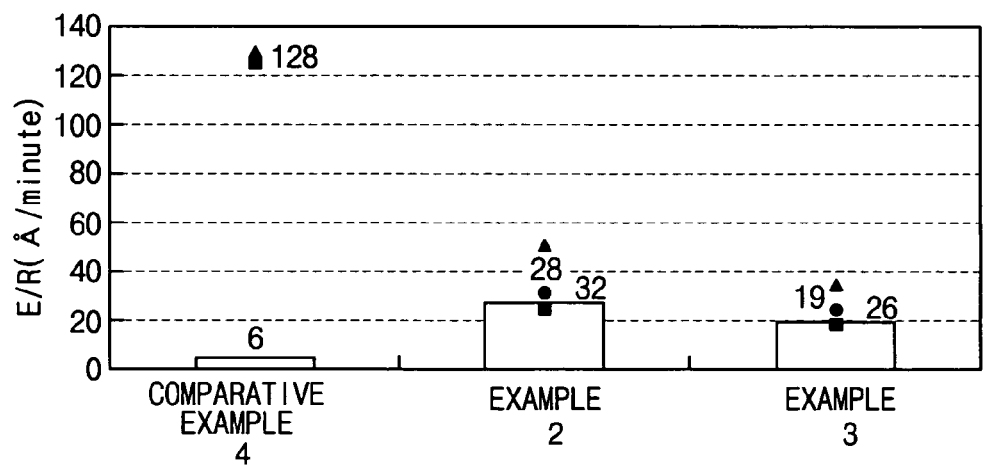

Referring to FIG. 9D, a mean etching rate for the polysilicon layer during the etching of the PE-TEOS and BPSG layers by a wet etching process using the etching composition according to Example 2 was about 32 Å/minute. The maximum etching rate thereof was about 46 Å/minute, and the minimum etching rate thereof was about 18 Å/minute. Therefore, the etching rate dispersion was about 28 Å/minute.

When the etching composition according to Example 3 was used, the mean etching rate for the polysilicon layer was about 26 Å/minute. The maximum etching rate thereof was about 35 Å/minute, and the minimum etching rate thereof was about 16 Å/minute. Therefore, the etching rate dispersion was about 19 Å/minute.

When the etching composition according to Comparative Example 4 was used, the mean etching rate for the polysilicon layer was about 128 Å/minute. The maximum etching rate thereof was about 131 Å/minute, and the minimum etching rate thereof was about 125 Å/minute. Therefore, the etching rate dispersion was about 3 Å/minute, which is relatively low. However, the etching rate for the polysilicon layer is undesirably high.

Since the etching compositions obtained from Examples 2 and 3 exhibit a lower etching rate than that obtained from Comparative Example 4, the etching compositions obtained from Examples 2 and 3 are preferred.

As illustrated in FIGS. 9A to 9D, when an oxide layer such as the PE-TEOS layer and the BPSG layer are etched using the etching composition according to the present invention, a large difference is shown in the etching rate with respect to the oxide layer, a small difference is shown in the etching rate with respect to the nitride layer, and an very low etching rate is shown for the polysilicon layer. Accordingly, an addition of the surfactant into the etching composition is effective in obtaining better etching results.

Method of Manufacturing a Semiconductor Device

FIGS. 10A to 10E are cross-sectional view illustrating a method of manufacturing a semiconductor device according to an embodiment of the present invention. In FIGS. 10A to 10E, the same reference numerals identify the same elements.

Figure 10A:
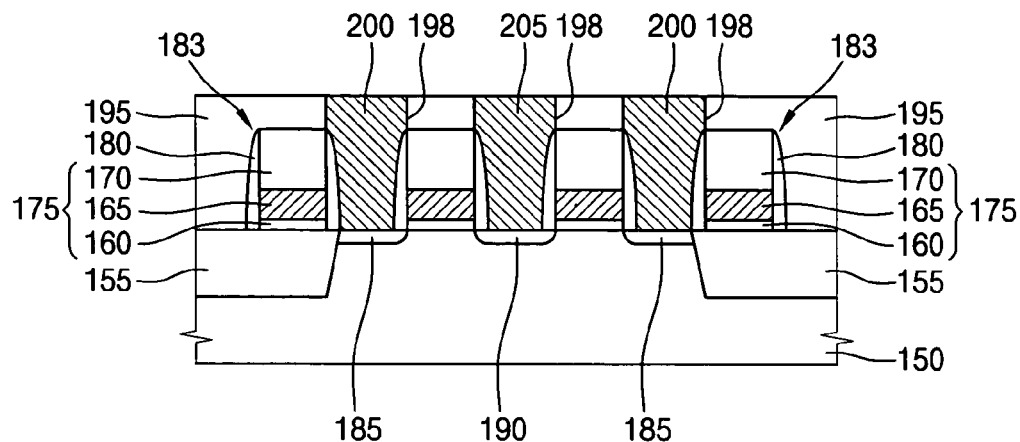
FIGS. 10A to 10E are cross-sectional views illustrating a method of manufacturing a semiconductor device according to an embodiment of the present invention.

FIG. 10A is a cross-sectional view illustrating a step for forming a first pad 200 and a second pad 205 on a semiconductor substrate 150 on which a transistor structure 183 including a gate structure 175 is formed.

Referring to FIG. 10A, an isolation layer 155 is formed on the semiconductor substrate 150 by an isolation method such as a shallow trench isolation (STI) method or a local oxidation of silicon (LOCOS) method to divide the semiconductor substrate 150 into an active region and a field region.

A thin gate oxide layer (not shown) is formed on the semiconductor substrate 150 by a thermal oxidation method or a chemical vapor deposition (CVD) method. A first conductive layer (not shown) and a first mask layer (not shown) are subsequently formed on the thin gate oxide layer. The first conductive layer and the first mask layer, respectively, correspond to a gate conductive layer and a gate mask layer. The first conductive layer is formed by using impurity-doped polysilicon and patterned to form a gate conductive pattern 165. The first conductive layer may also be formed as a polycide structure having doped polysilicon and metal silicide.

The first mask layer is patterned to form a gate mask pattern 170 and formed by using a material having an etching selectivity with respect to a first interlayer dielectric 195 (subsequently formed). For example, when the first interlayer dielectric 195 is formed using an oxide, the first mask layer is formed using a nitride such as silicon nitride.

A first photoresist film (not shown) is disposed on the first mask layer, and the first photoresist film is exposed and developed to obtain a first photoresist pattern (not shown). The first mask layer, the first conductive layer, and the gate oxide layer are subsequently patterned by using the first photoresist pattern as an etching mask to form a gate structure 175, which includes a gate oxide pattern 160, a gate conductive pattern 165, and the gate mask pattern 170.

On the semiconductor substrate 150 and on the gate structures 175, a first dielectric layer (not shown) is formed using a nitride such as silicon nitride. Then, the first dielectric layer is anisotropically etched to form a first spacer 180 as a gate spacer on the sidewalls of the gate structure 175.

Subsequently, after impurities are doped by an ion implantation process into the exposed semiconductor substrate 150 between the gate structures 175 by using the gate structures 175 as an ion implanting mask, a heat treatment is performed to form a first contact region 185 and a second contact region 190, i.e., source/drain regions. Accordingly, MOS transistor structures 183 having the first and the second contact regions 185 and 190 are formed The first and second contact regions 185 and 190 are divided into a capacitor contact region and a bit line contact region for connection (subsequent step) with a first pad for a capacitor 200 and a second pad for a bit line 205, respectively. In other words, the first contact region 185 corresponds to the storage node contact region for making contact with the first pad 200, and the second contact region 190 corresponds to the bit line contact region for contacting with the second pad 205.

The first interlayer dielectric 195 is formed using an oxide material on the entire surface portion of the semiconductor substrate 150 including the transistor structures 183. The first interlayer dielectric 195 can be BPSG, USG or HDP-CVD oxide material.

The upper portion of the first interlayer dielectric 195 is planarized by etching the upper portion of the interlayer dielectric 195 by means of a chemical mechanical polishing (CMP) process, an etch back process, or a combination thereof.

On the planarized first interlayer dielectric 195, a second photoresist film (not shown) is coated thereon. The second photoresist film is exposed and developed to form a second photoresist pattern. Then, the first interlayer dielectric 195 is partially and anisotropically etched using the second photoresist pattern as an etching mask to form first contact holes 198 to expose the first and second contact regions 185 and 190. Accordingly, the first contact holes 198 are self-aligned with respect to the transistor structures 183, while exposing the first and second contact regions 185 and 190.

The second photoresist pattern is removed by an ashing process and a strip process. A second conductive layer (not shown) is formed on the first interlayer dielectric 195 filling the first contact holes 198. The second conductive layer is formed using a high concentration of impurity-doped polysilicon or a metal.

Figure 10B:
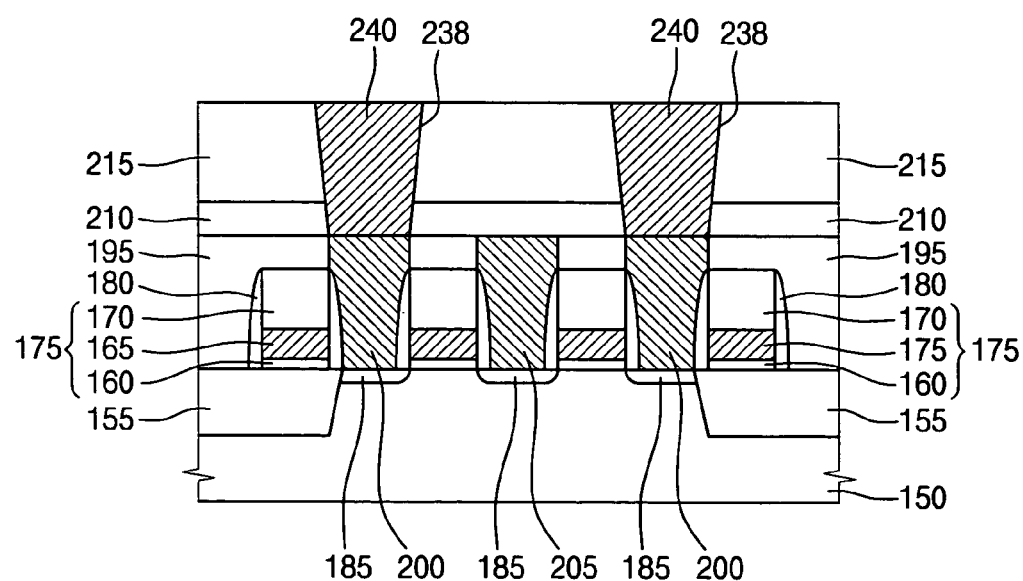

The second conductive layer is etched by a CMP process, an etch back process, or a combination thereof until the upper surface of the planarized first interlayer dielectric 195 is exposed, to form a first pad 200 and a second pad 205, wherein the first and second pads 200 and 205 are self-aligned contact (SAC). FIG. 10B is a cross-sectional view illustrating steps of forming a bit line and a fourth pad 240.

Referring to FIG. 10B, a second interlayer dielectric 210 is formed using BPSG, USG or HDP-CVD oxide material on the first interlayer dielectric 195 and on the first and second pads 200, 205. The second interlayer dielectric 210 electrically insulates the bit line (subsequently formed) from the first pad 200 of the first storage node contact pad.

The second interlayer dielectric 210 is etched by a CMP process, an etch back process, or a combination thereof, to planarize the upper surface of the second interlayer dielectric 210.

A third photoresist film (not shown) is coated on the second interlayer dielectric 210. The third photoresist film is exposed and developed to form a third photoresist pattern (not shown).

The second interlayer dielectric 210 is partially etched by using the third photoresist pattern as an etching mask to form a second contact hole (not shown) in the second interlayer dielectric 210 to expose the second pad 205 of the first bit line contact pad buried in the first interlayer dielectric layer 195. The second contact hole corresponds to a bit line contact hole for electrically connecting the bit line with the second pad 205 of the first bit line contact pad.

The third photoresist pattern is removed by an ashing process and a strip process. A third conductive layer (not shown) and a second mask layer (not shown) are then subsequently formed on the second interlayer dielectric 210 filling up the second contact hole of the bit line contact hole. The third conductive layer and the second mask layer are patterned to form a bit line conductive layer pattern (not shown) and a bit line mask pattern (not shown), respectively.

A fourth photoresist film is coated on the second mask layer. The fourth photoresist film is exposed and developed to form a fourth photoresist pattern (not shown) on the second mask layer. The second mask layer and the third conductive layer are subsequently patterned using the fourth photoresist pattern as an etching mask to form a third pad (not shown) filling up the second contact hole corresponding to a bit line contact hole, and to form a bit line (not shown) including the bit line conductive pattern, and a bit line mask layer pattern.

The third pad corresponds to a second bit line contact pad for electrically connecting the bit line with the second pad 205 of the first bit line contact pad. The third pad is also known as a first plug of a bit line contact plug. The bit line mask pattern passivates the bit line conductive pattern during a subsequently implemented etching process for forming a fourth contact hole 270 (FIG. 10C) of the storage node contact hole. The bit line mask pattern is formed by using a material having an etching selectivity with respect to a fourth interlayer dielectric 250 formed by using an oxide, a first oxide layer 260, and a second oxide layer 265. For example, the bit line mask pattern is formed using a nitride such as silicon nitride.

A second dielectric layer (not shown) is formed on the bit lines and the second interlayer dielectric 210. Then, the second dielectric layer is anisotropically etched to form a second spacer (not shown) corresponding to a bit line spacer on the side wall portion of each bit line. The second spacer is formed by using a material having an etching selectivity with respect to the second interlayer dielectric 210, and a third interlayer dielectric 215 (subsequently formed) for passivating the bit line during the formation of the fourth pad 240 of the second storage node contact pad.

A third interlayer dielectric 215 is formed on the second interlayer dielectric 210 while covering the bit line including the second spacer on the side wall portion thereof. The third interlayer dielectric 215 is formed using an oxide compound such as BPSG, USG, and HDP-CVD oxide.

The third interlayer dielectric 215 is etched by a CMP process, an etch back process, or a combination thereof until the upper surface portion of the bit line mask pattern is exposed to planarize the upper surface of the third interlayer dielectric 215.

A fifth photoresist film is coated on the planarized third interlayer dielectric 215. The fifth photoresist film is exposed and developed to form a fifth photoresist pattern (not shown). The third interlayer dielectric 215 and the second interlayer dielectric 210 are partially etched by using the fifth photoresist pattern as an etching mask to form third contact holes 238 for exposing the first pads 200. The third contact holes 238 correspond to the first storage node contact holes. The third contact holes 238 are formed in a self-aligning manner with respect to the second spacer formed on the sidewall portion of the bit line.

A fourth conductive layer is formed on the third interlayer dielectric 215 filling the third contact holes 238. Then, the fourth conductive layer is etched by a CMP process, an etch back process, or a combination thereof until the upper surfaces of the third interlayer dielectric 215 and the bit line are exposed to form the fourth pad 240 of the second storage node contact pad within the third contact holes. The fourth pad 240 is also known as a second plug of the storage node contact plug. The fourth pad 240 is formed using a conductive material such as impurity-doped polysilicon. The fourth pad 240 electrically connects the first pad 200 of the first storage node contact pad with a storage electrode 290 (refer to FIG. 9D). Accordingly, the storage electrode 290 is electrically connected to the first contact region 185 of the storage node contact region through the first pad 200 and fourth pad 240.

Figure 10C:
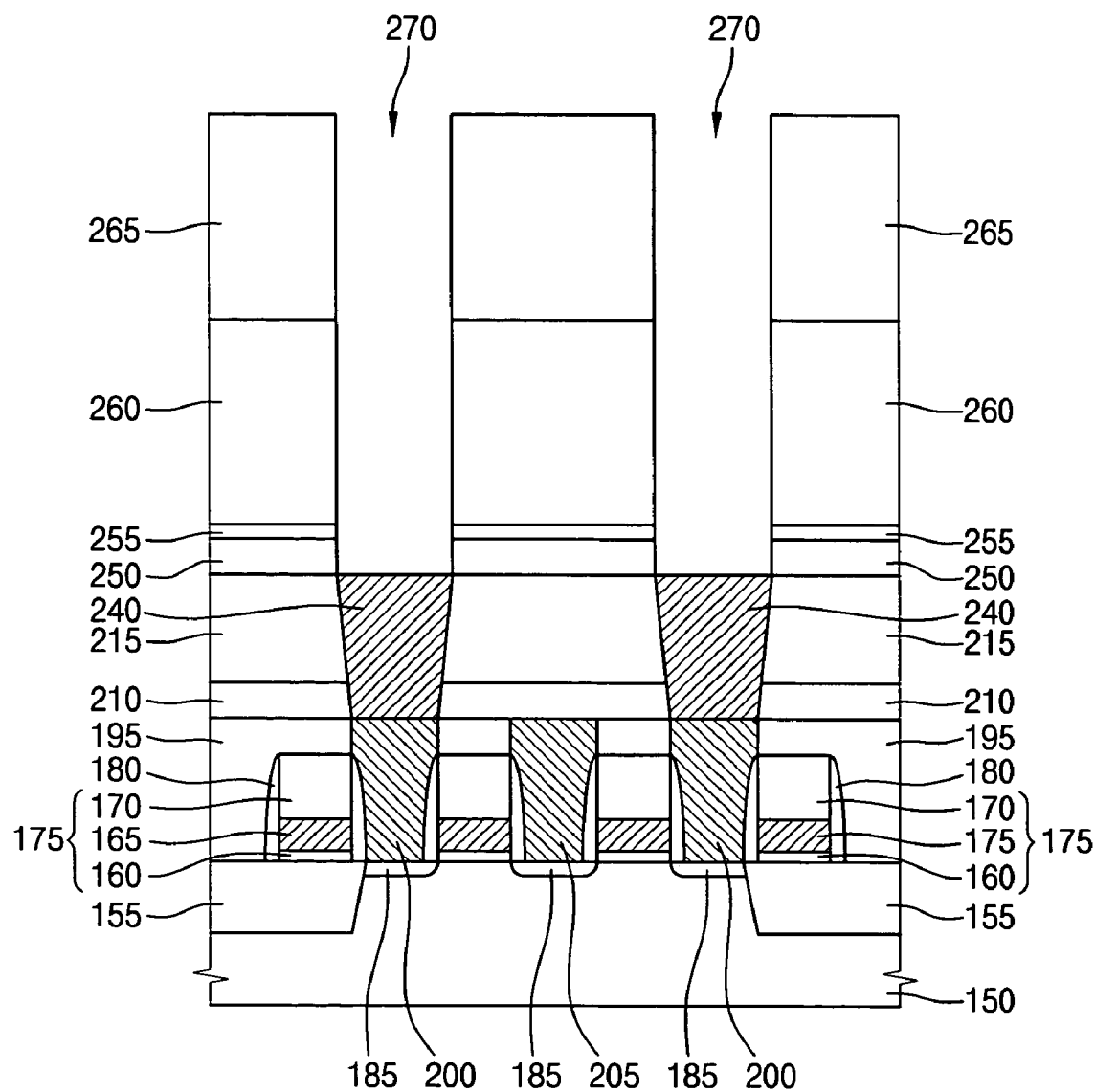

FIG. 10C is a cross-sectional view illustrating a step of forming a fourth contact hole 270 and a storage electrode 290.

Referring to FIG. 10C, a fourth interlayer dielectric 250 is formed by BPSG, USG, SOG, or HDP-CVD oxide on the fourth pad 240 of the second storage node contact pad, the bit line, and the third interlayer dielectric 215. The fourth interlayer dielectric 250 electrically divides the bit line from the storage electrode 290.

An etch stop layer 255 is formed on the fourth interlayer dielectric 250. The etch stop layer 255 is formed by using an etching selectivity with respect to the fourth interlayer dielectric 250, the first oxide layer 260, and the second oxide layer 265. For example, the etch stop layer 255 is formed by using a nitride compound such as silicon nitride. Here, after the upper surface of the fourth interlayer dielectric 250 is planarized by a CMP process, an etch back process or a combination thereof, and the etch stop layer 255 may be formed on the planarized fourth interlayer dielectric 250.

On the etch stop layer 255, a first oxide layer 260 and a second oxide layer 265 are formed to function as a mold for forming a storage electrode 290. The first oxide layer 260 is formed using BPSG or USG, and the second oxide layer 265 is formed using an oxide material such as PE-TEOS. The first and second oxide layers 260,265 may be formed to a thickness of about 5,000 to about 50,000 Å on the upper surface of the etch stop layer 255. However, the total thickness of the first and second oxide layers 260 and 265 may be appropriately controlled according to the required capacitance of a capacitor 310 (refer to FIG. 10E). That is, the height of the capacitor 310 is determined by the thickness of the first and second oxide layers 260, 265.

A sixth photoresist film (not shown) is formed on the second oxide layer 265. The sixth photoresist film is patterned by exposure and development to form a sixth photoresist pattern on the second oxide layer 265.

The second oxide layer 265, the first oxide layer 260, the etch stopping layer 255, and the fourth interlayer dielectric 250 are partially etched using the sixth photoresist pattern as an etching mask to form a fourth contact hole 270 of the storage node contact hole for exposing the fourth pad 240.

Figure 10D:
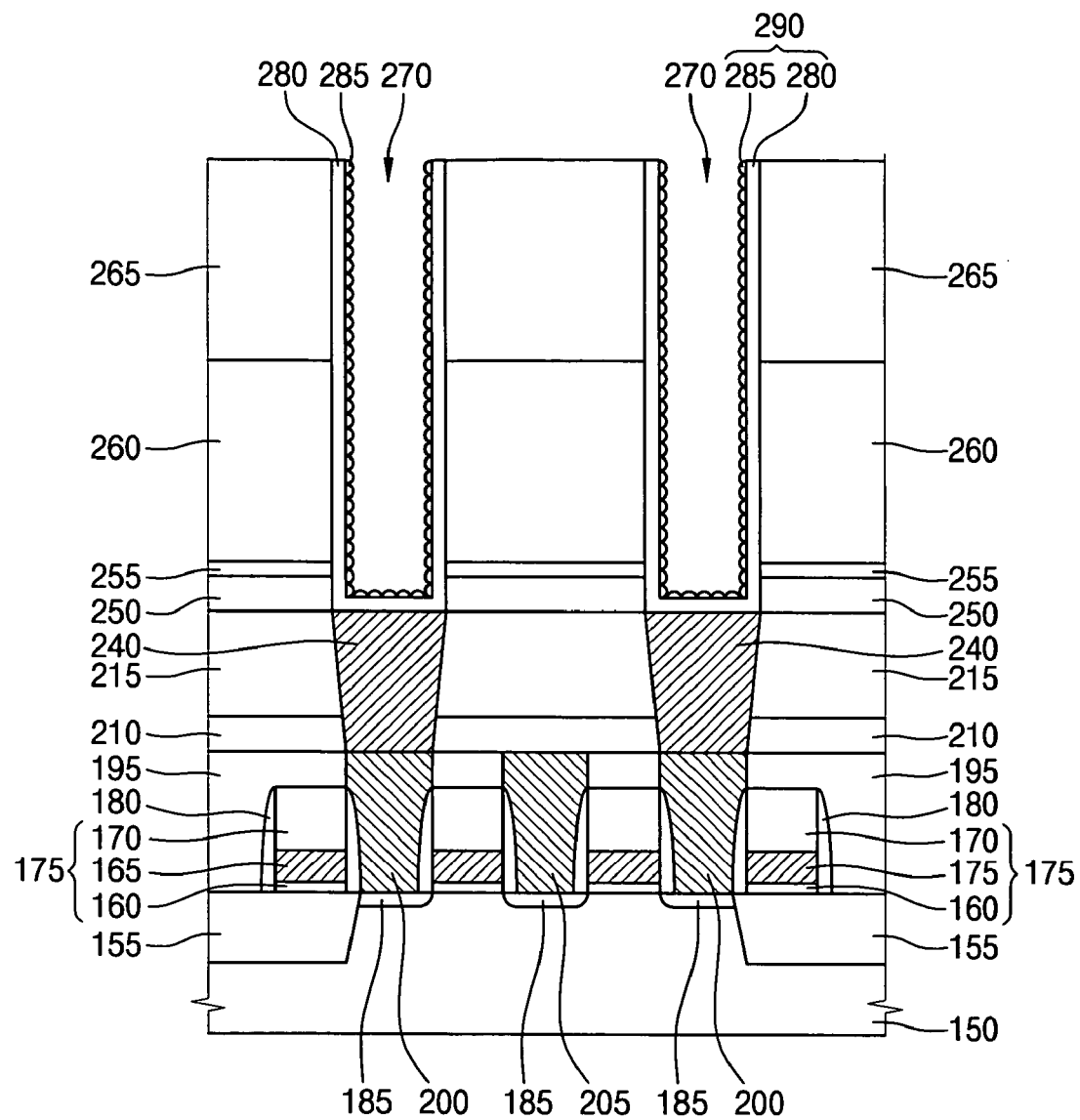

FIG. 10D is a cross-sectional view illustrating a step of forming a storage electrode 290 within the fourth contact hole 270.

Referring to FIG. 10D, the sixth photoresist pattern is removed through an ashing process and a strip process. A fifth conductive layer of an impurity doped polysilicon is then formed on the exposed fourth pad 240 and the inner wall portion of the fourth contact hole 270.

A portion of the fifth conductive layer is removed by a CMP process, an etch back process, or a combination thereof until the upper surface of the second oxide layer 265 is exposed to form a conductive layer pattern 280 on the fourth pad 240 and the inner wall portions of the fourth contact hole 270.

An HSG silicon layer 285 is selectively grown on the surface of the conductive pattern 280 to form a storage electrode 290, which is electrically connected to the first contact region 185.

Figure 10E:
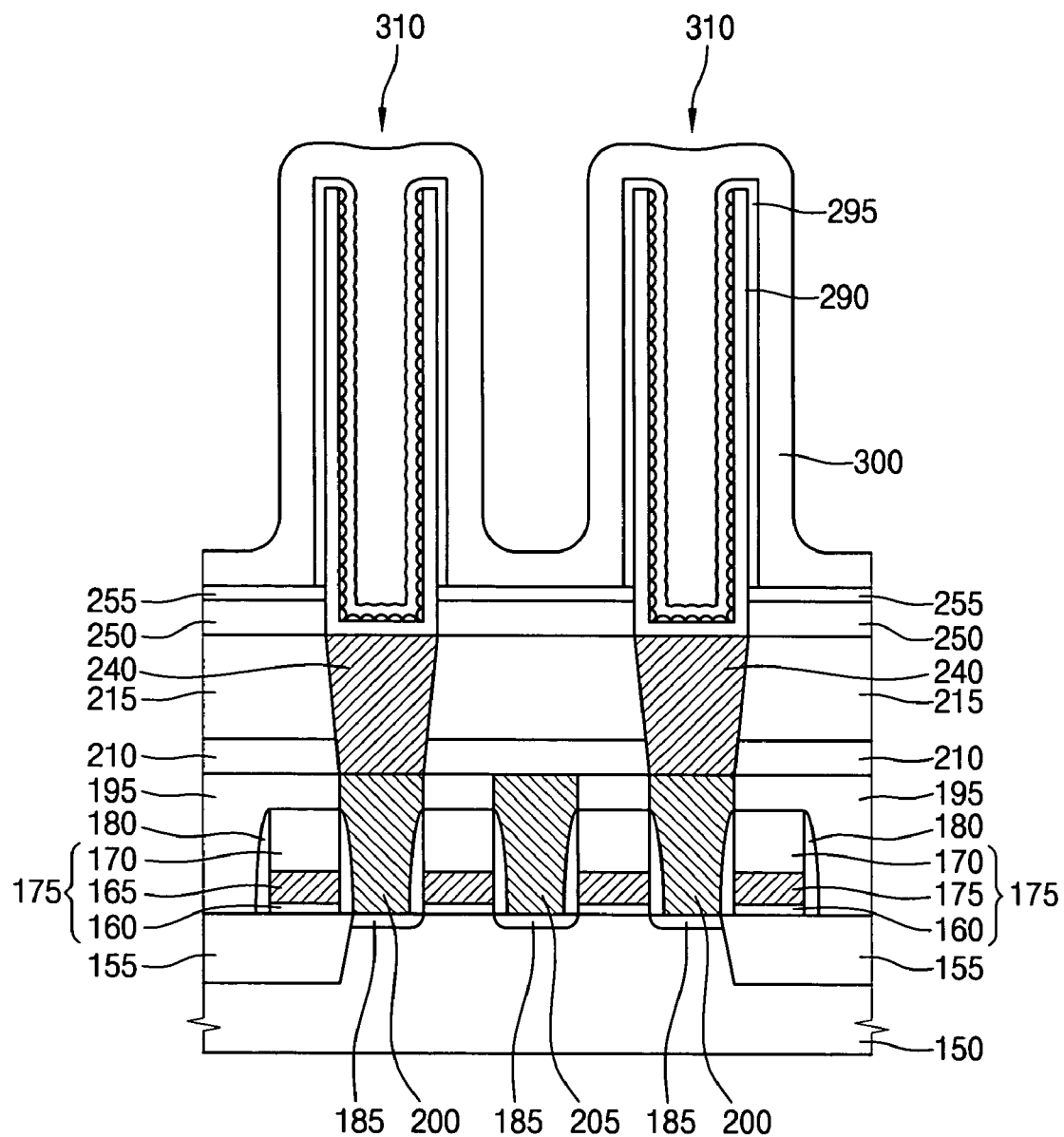
Figure 11A:
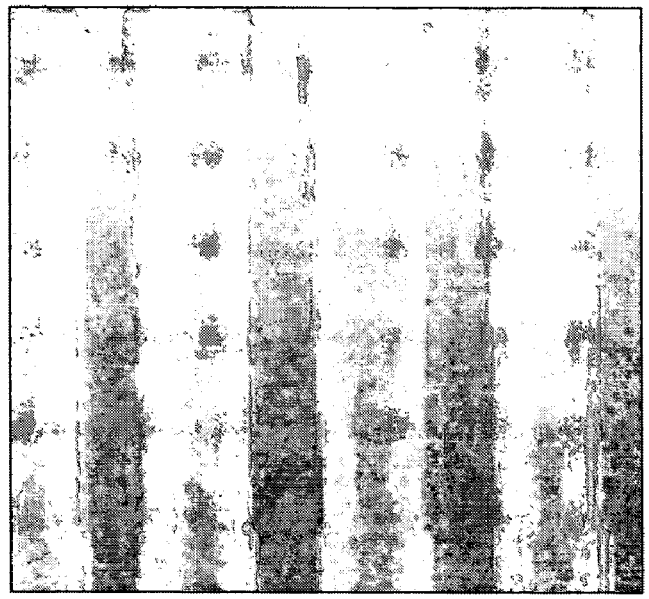
FIGS. 11A to 11F are images taken by an electron microscope showing oxide layers etched using an etching composition according to an embodiment of the present invention.
Figure 11B:
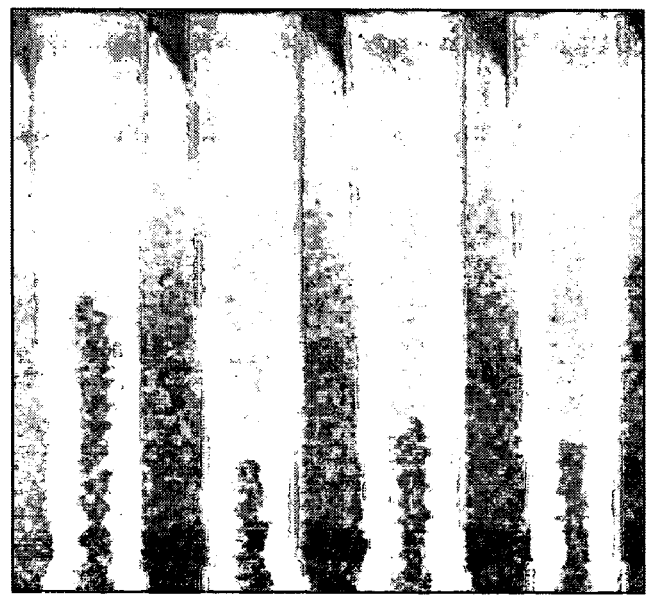
Figure 11C:
Figure 11D:
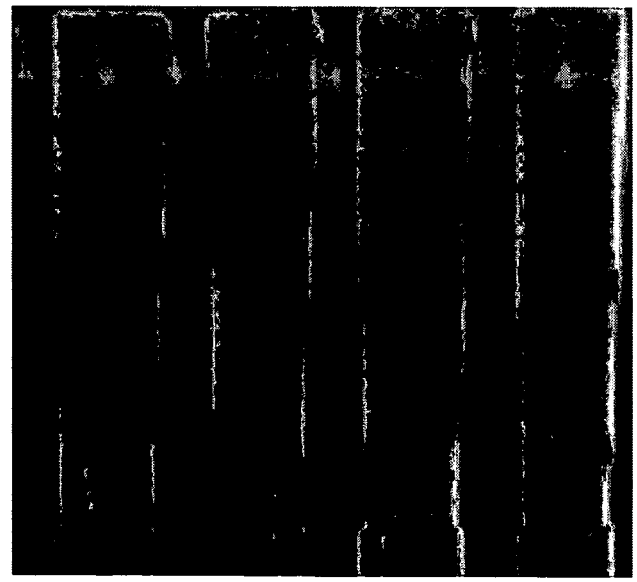
Figure 11E:
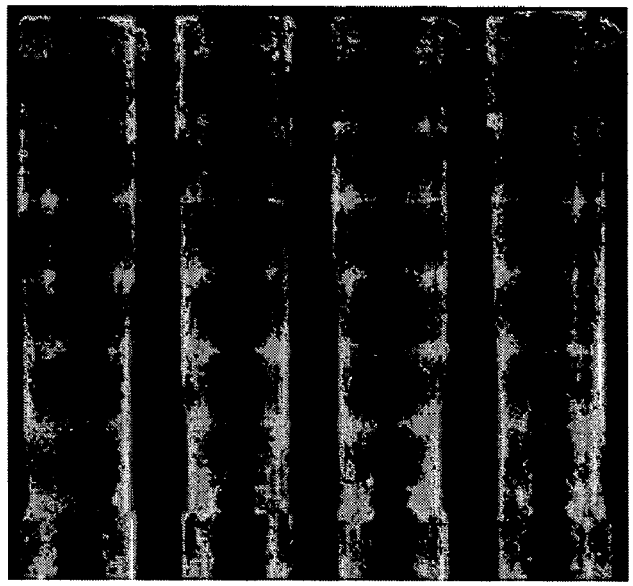
Figure 11F:
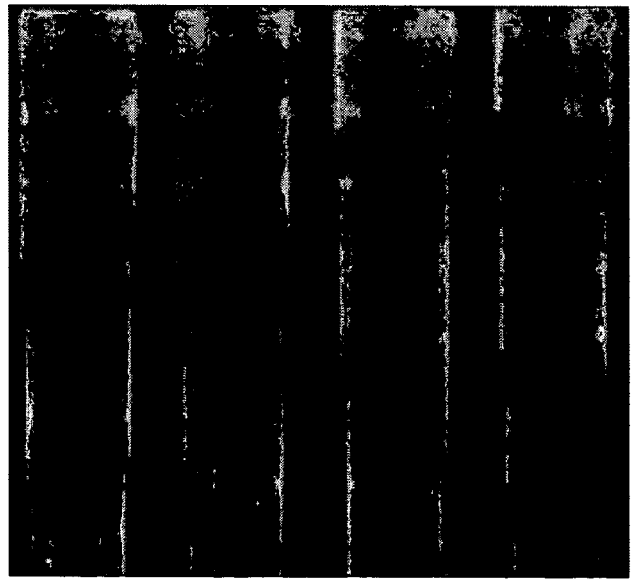

FIG. 10E is a cross-sectional view illustrating a step of forming the capacitor 310.

Referring to FIG. 10E, the second oxide layer 265 and the first oxide layer 260 are removed by a wet etching process using an etching composition according to an embodiment of the present invention.

A dielectric film 295 of a nitride material or an oxide material is formed on a bottom surface, the inner wall portion, and the outer wall portion of the storage electrode 290. Then, an upper electrode 300 is formed on the dielectric film 295 using a metal or an impurity doped polysilicon to complete the capacitor 310. The upper electrode 300 and the dielectric film 295 are patterned to separate each capacitor 310 from the other. A fifth interlayer dielectric (not shown) is formed on the capacitor 310 for an electrical insulation with an upper wiring. The upper wiring is formed on the fifth interlayer dielectric to form a semiconductor device.

According to embodiments of the present invention, an etching process for removing the second and first oxide layers 265 and 260 by using an etching composition having the above-described properties will be described in further detail below.

FIGS. 11A to 11F are image taken by an electron microscope for illustrating a wet etching result of the first and the second oxide layers 260 and 265 using an etching composition according to an embodiment of the present invention. These figures respectively illustrate results after executing a wet etching process using the etching composition for about 15 minutes, about 16 minutes, about 17 minutes, about 18 minutes, about 19 minutes and about 20 minutes, respectively.

As illustrated in FIGS. 11A to 11F, the storage electrode 290 formed by using polysilicon is not damaged during the etching of the second oxide layer 265 and the first oxide layer 260.

FIGS. 12A and 12B are plan views illustrating the thickness dispersion of the remaining nitride layer after a dipping-type etching process and a circulating-type etching process, respectively, using an etching composition according to an embodiment of the present invention.

FIG. 12A is a plan view illustrating the thickness dispersion of the etch stop layer 255, which is the remaining nitride layer on the semiconductor substrate 150 when the wet etching process is performed using a dipping technique. FIG. 12B is a plan view illustrating the thickness dispersion of the etch stop layer 255, which is the remaining nitride layer on the semiconductor substrate 150 when the wet etching process is performed using a circulating technique.

Referring to FIG. 12A, the dipping-type wet etching process was implemented for about 900 seconds. A mean thickness of the etch stopping layer 255 remaining on the semiconductor substrate 150 was about 404 Å, a maximum thickness thereof was about 411 Å and a minimum thickness thereof was about 395 Å. Therefore, the thickness dispersion of the remaining etch stopping layer 255 was about 15 Å.

That is, when the etching process was carried out using the etching composition according to an embodiment of the present invention, the thickness dispersion of the nitride layer was substantially decreased when compared with the conventional etching composition.

Referring to FIG. 12B, the circulating-type wet etching process was implemented for about 840 seconds. A mean thickness of the etch stop layer 255 remaining on the semiconductor substrate 150 was about 470 Å. The maximum thickness thereof was about 474 Å, and the minimum thickness thereof was about 462 Å. Therefore, the thickness dispersion of the remaining etch stopping layer 255 was about 12 Å, which is very low. Accordingly, an etching uniformity is distinctively improved when the oxide layer is selectively removed by a wet etching process using an etching composition according to an embodiment of the present invention.

According to embodiments of the present invention, an etching composition by which a pattern or a storage electrode formed using polysilicon may be effectively passivated, i.e., shielded from over etching. When the oxide layer is selectively removed by a wet etching process using the etching composition, the oxide layer is removed with a high etching selectivity, and the polysilicon layer is protected from damaged. In addition, the etching uniformity generated by the wet etching process for selectively removing the oxide layer is greatly improved when comparing with conventional etching compositions.

While the present invention is described in detail referring to the attached embodiments, various modifications, alternate constructions and equivalents may be employed without departing from the true spirit and scope of the present invention.

What is claimed is:

1. An etching composition comprising about 0.1 to 8% by weight of hydrogen fluoride (HF), about 10 to 25% by weight of ammonium fluoride ($NH_4F$), about 0.0001 to 3% by weight of a non-ionic polymer surfactant, and water ($H_2O$), wherein the non-ionic polymer surfactant has a structure of $H-(OCH_2CH_2)_x-(OCH(CH_3)CH_2)_y-(OCH_2CH_2)_z-OH$, wherein x, y and z are positive integers, and wherein the average molecular weight of the non-ionic polymer surfactant is about 3,000 or less.

2. The etching composition of claim 1, wherein an amount of the non-ionic polymer surfactant is in a range of about 0.001 to about 0.02% by weight.

3. An etching composition comprising about 0.1 to 8% by weight of hydrogen fluoride (HF), about 10 to 25% by weight of ammonium fluoride ($NH_4F$), about 0.0001 to 3% by weight of a non-ionic polymer surfactant, and water ($H_2O$), wherein the poly-alcoholic non-ionic polymer surfactant is polyoxyethylene added sorbitan ester as represented by the following structure,

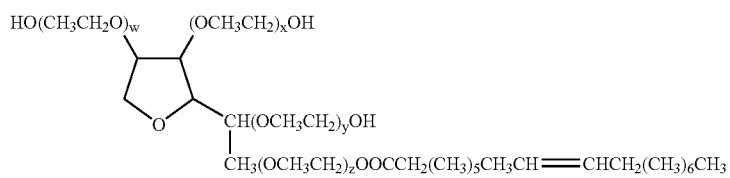

wherein, w, x, y and z are positive integers.

* * * * *